US011100961B2

(12) United States Patent
Yoshihara et al.

(10) Patent No.: US 11,100,961 B2
(45) Date of Patent: Aug. 24, 2021

(54) SEMICONDUCTOR STORAGE DEVICE

(71) Applicant: KIOXIA CORPORATION, Tokyo (JP)

(72) Inventors: Hiroshi Yoshihara, Fujisawa Kanagawa (JP); Tetsuya Amano, Funabashi Chiba (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/012,673

(22) Filed: Sep. 4, 2020

(65) Prior Publication Data
US 2020/0402548 A1 Dec. 24, 2020

Related U.S. Application Data

(63) Continuation of application No. 16/552,801, filed on Aug. 27, 2019, now Pat. No. 10,796,732.

(30) Foreign Application Priority Data

Dec. 21, 2018 (JP) .............................. JP2018-239621

(51) Int. Cl.
G11C 5/14 (2006.01)
G11C 16/30 (2006.01)
G11C 16/08 (2006.01)

(52) U.S. Cl.
CPC .............. G11C 5/147 (2013.01); G11C 16/08 (2013.01); G11C 16/30 (2013.01)

(58) Field of Classification Search
CPC ........... G11C 5/147; G11C 5/148; G11C 8/10; G11C 8/14; G11C 16/08
See application file for complete search history.

(56) References Cited

U.S. PATENT DOCUMENTS

| 6,067,269 | A | * | 5/2000 | Han | ......................... G11C 8/08 365/226 |
| 7,142,468 | B2 | | 11/2006 | Kato et al. | |
| 9,647,652 | B2 | | 5/2017 | Chi et al. | |
| 2008/0130379 | A1 | | 6/2008 | Ohsawa | |
| 2012/0243338 | A1 | | 9/2012 | Nakamura | |
| 2013/0114338 | A1 | * | 5/2013 | Park | ....................... G11C 16/30 365/185.03 |
| 2019/0080736 | A1 | * | 3/2019 | Baeck | ................... G11C 11/418 |

FOREIGN PATENT DOCUMENTS

JP 2013020661 A 1/2013

* cited by examiner

Primary Examiner — Han Yang
(74) Attorney, Agent, or Firm — Kim & Stewart LLP

(57) ABSTRACT

A semiconductor storage device includes a first word line electrically connected to a first memory cell, a second word line electrically connected to a second memory cell, and a voltage generation circuit configured to supply a first voltage to a first line electrically connected to the first word line and a second voltage to a second line electrically connected to the second word line. The voltage generation circuit includes a first regulator configured to output the first voltage to the first line and output a first signal according to the first voltage, a second regulator configured to output the second voltage to the second line and output a second signal according to the second voltage, and a switch circuit configured to open or close an electrically conductive path between the first line and the second line, based on at least one of the first signal and the second signal.

16 Claims, 16 Drawing Sheets

SEMICONDUCTOR STORAGE DEVICE

CROSS-REFERENCE TO RELATED APPLICATION

This application is a continuation of U.S. patent application Ser. No. 16/552,801 filed Aug. 27, 2019, which is based upon and claims the benefit of priority from Japanese Patent Application No. 2018-239621, filed Dec. 21, 2018, the entire contents of which are incorporated herein by reference.

FIELD

Embodiments described herein relate generally to a semiconductor storage device.

BACKGROUND

A semiconductor storage device in which memory cells are three-dimensionally arranged is known.

DETAILED DESCRIPTION

Figure 1:
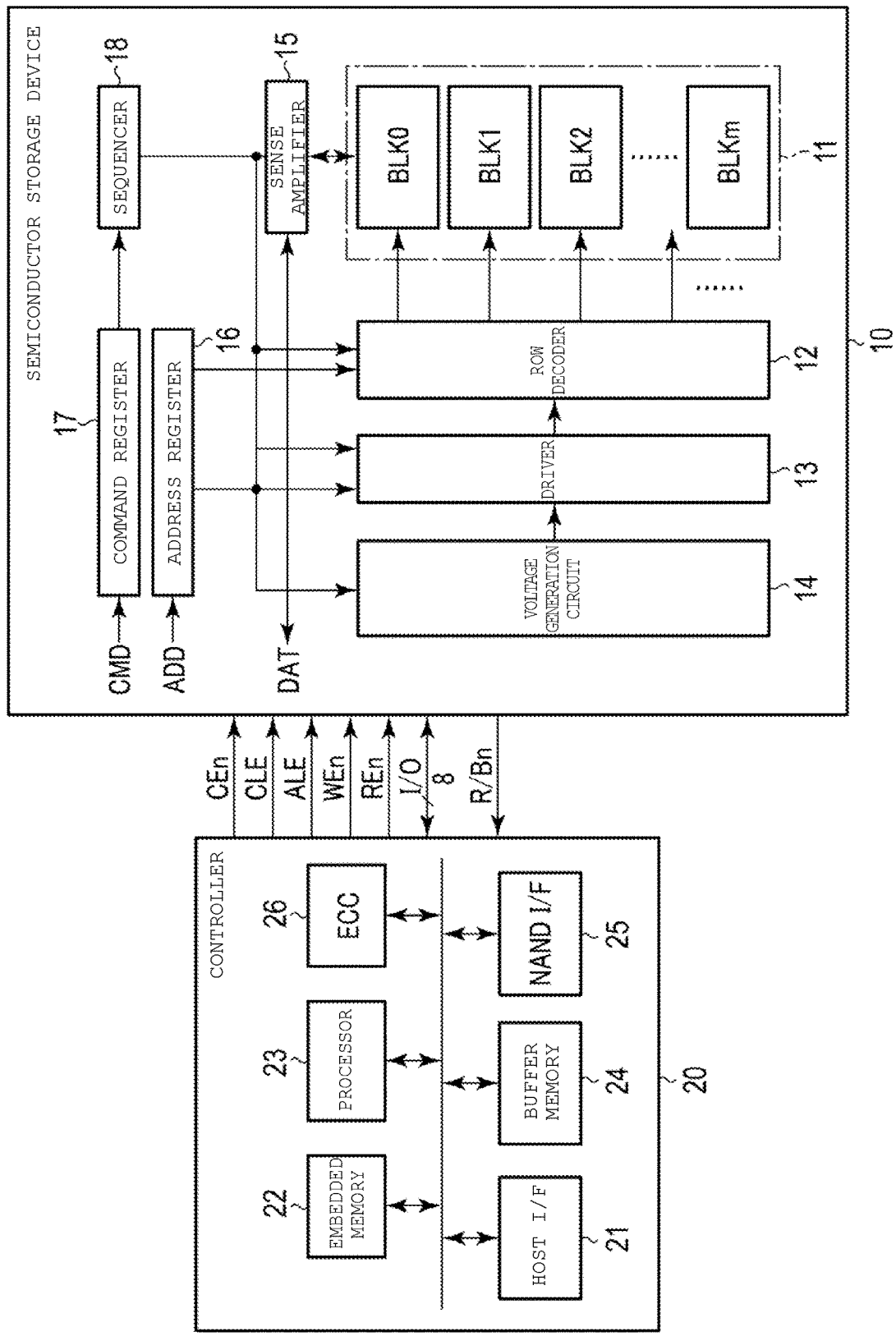
FIG. 1 is a block diagram illustrating a configuration of a semiconductor storage device according to a first embodiment.

Embodiments provide a semiconductor storage device capable of increasing an operation speed.

In general, according to one embodiment, a semiconductor storage device includes a first word line electrically connected to a first memory cell, a second word line electrically connected to a second memory cell, and a voltage generation circuit configured to supply a first voltage to a first line electrically connected to the first word line and a second voltage to a second line electrically connected to the second word line. The voltage generation circuit includes a first regulator configured to output the first voltage to the first line and output a first signal according to the first voltage, a second regulator configured to output the second voltage to the second line and output a second signal according to the second voltage, and a switch circuit configured to open or close an electrically conductive path between the first line and the second line, based on at least one of the first signal and the second signal In the following description on the embodiments, elements having the same function and configuration are given the same reference numerals or symbols. Each embodiment described below provides an example of a device and a method for embodying the technical idea thereof, and materials, shapes, structures, arrangements, and the like described herein are not limited to those given for the example.

Each functional block may be implemented as hardware, computer software, or a combination of both. It is not essential that each functional block is separately depicted as in the following example. For example, a partial function may be performed by a functional block other than the depicted functional block. Furthermore, the depicted functional block may be further divided into smaller functional sub-blocks. Here, for example, a three-dimensionally stacked NAND flash memory in which a memory cell transistor is stacked on a semiconductor substrate will be described as an example of a semiconductor storage device.

1. First Embodiment

A semiconductor storage device according to a first embodiment will be described below.

1.1 Configuration of Semiconductor Memory Device

A configuration of the semiconductor storage device according to the first embodiment will be described with reference to FIG. 1. FIG. 1 is a block diagram illustrating the configuration of the semiconductor storage device according to the first embodiment.

A semiconductor storage device 10 includes a plurality of memory cells that store data in a nonvolatile manner. As illustrated in FIG. 1, the semiconductor storage device 10 includes a memory cell array 11, a row decoder 12, a driver 13, a voltage generation circuit 14, a sense amplifier 15, an address register 16, a command register 17, and a sequencer 18. In addition, a controller 20 is connected to the semiconductor storage device 10 externally through a NAND bus. The controller 20 accesses the semiconductor storage device 10 and controls the semiconductor storage device 10. Details of the NAND bus and the controller 20 will be described below.

The memory cell array 11 includes a plurality of blocks BLK0, BLK1, BLK2, . . . , BLKn (n is an integer greater than or equal to 0) including a plurality of nonvolatile memory cells associated with a row and a column. Hereinafter, it is assumed that, when a block BLK is described, the block BLK indicates the blocks BLK0 to BLKn. The memory cell array 11 stores data supplied from controller 20. Details of the memory cell array 11 and the block BLK will be described below.

The row decoder 12 selects one of the blocks BLK and further selects a word line in the selected block BLK. Details of the row decoder 12 will be described below.

The driver 13 supplies a voltage to the selected block BLK through the row decoder 12.

The voltage generation circuit 14 generates various voltages necessary for write, read, and erasure of data, and supplies the generated voltages to the driver 13.

At the time of data read, the sense amplifier 15 senses data DAT read from the memory cell array 11, and performs arithmetic operations to complete the read. The data DAT is output to the controller 20. The sense amplifier 15 transfers the write data DAT received from the controller 20 to the memory cell array 11 when writing data.

The address register 16 stores an address ADD received from the controller 20. The address ADD includes a block address designating an operation target block BLK and a page address designating an operation target word line in the designated block. The command register 17 stores a command CMD received from the controller 20. The command CMD includes, for example, a write command instructing the sequencer 18 to perform a write operation, a read command instructing a read operation, and the like.

The sequencer 18 controls an operation of the semiconductor storage device 10 based on the command CMD stored in the command register 17. Specifically, the sequencer 18 controls the row decoder 12, the driver 13, the voltage generation circuit 14, and the sense amplifier 15 based on the write command held in the command register and performs writing to a plurality of memory cell transistors designated by the address ADD. The sequencer also controls the row decoder 12, the driver 13, the voltage generation circuit 14, and the sense amplifier 15 based on the read command stored in the command register 17 and performs reading from the plurality of memory cell transistors designated by the address ADD.

As described above, the controller 20 is connected to the semiconductor storage device 10 through the NAND bus. The NAND bus transmits and receives signals according to a NAND interface. Specifically, the NAND bus includes a bus transmitting, for example, a chip enable signal CEn, a command latch enable signal CLE, an address latch enable signal ALE, a write enable signal WEn, a read enable signal REn, an input/output signal I/O, and a ready/busy signal R/Bn. The input/output signal I/O contains eight bits. The input/output signal I/O includes the command CMD, the address ADD, the data DAT and the like.

Next, a configuration of the controller 20 will be described with reference to FIG. 1. The controller 20 includes a host interface (I/F) circuit 21, an embedded memory 22, a processor (for example, CPU) 23, a buffer memory 24, a NAND interface (I/F) circuit 25, and an error checking and correcting (ECC) circuit 26.

The host interface circuit 21 is connected to a host device (not illustrated) through a host bus. The host interface circuit 21 transfers command and data received from the host device to the processor 23 and the buffer memory 24, respectively. The host interface circuit 21 transfers data in the buffer memory 24 to the host device in response to a command from the processor 23.

The processor 23 controls the overall operation of the controller 20. For example, when the processor 23 receives a write command from the host device, the processor issues a write command to the NAND interface circuit 25 in response to the write command. The same applies to read and erasure. The processor 23 performs various processes for managing the semiconductor storage device 10, such as wear-leveling. An operation of the controller 20 which will be described below may be implemented by the processor 23 executing software (or firmware) or may be implemented by hardware.

The NAND interface circuit 25 is connected to the semiconductor storage device 10 through the NAND bus, and communicates with the semiconductor storage device 10. The NAND interface circuit 25 transmits various signals to the semiconductor storage device 10 and receives various signals from the semiconductor storage device 10, based on a command received from the processor 23.

The buffer memory 24 temporarily stores write data and read data. The buffer memory 24 may include a DRAM, an SRAM or the like.

The embedded memory 22 is a semiconductor memory such as a DRAM or an SRAM, and is used as a work area of the processor 23. The embedded memory 22 has firmware for managing the semiconductor storage device 10, various management tables, and the like.

The ECC circuit 26 performs error detection and error correction processes on data stored in the semiconductor storage device 10. That is, the ECC circuit 26 generates an error correction code when writing data, adds the error correction code to the write data, and decodes the error correction code when reading data.

1.1.1 Configuration of Memory Cell Array 11

As described above, the memory cell array 11 includes the blocks BLK0 to BLKn. Here, a circuit configuration of one block BLK will be described.

Figure 2:
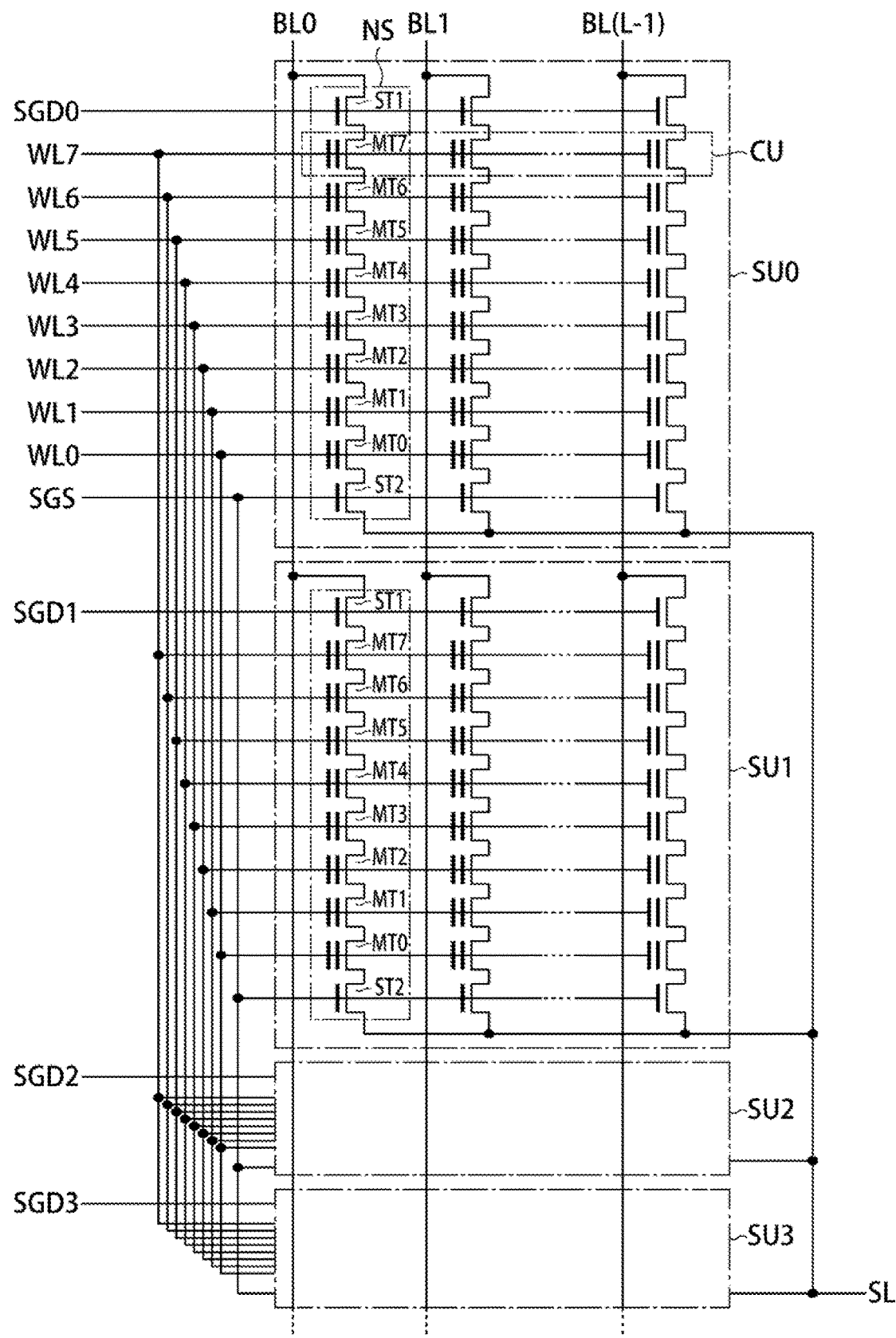
FIG. 2 is a circuit diagram of a block in a memory cell array according to the first embodiment.

FIG. 2 is a circuit diagram of the block BLK in the memory cell array 11. As illustrated, the block BLK includes, for example, four string units SU0 to SU3. Hereinafter, it is assumed that, when one string unit SU is described, the string unit SU indicates each of the string units SU0 to SU3. The string unit SU includes a plurality of NAND strings NS.

Each of the NAND strings NS includes, for example, eight memory cell transistors MT0 to MT7 and select transistors ST1 and ST2. Hereinafter, it is assumed that, when one memory cell transistor MT is described, the memory cell transistor MT indicates each of the memory cell transistors MT0 to MT7. The memory cell transistor (hereinafter, also referred to as a memory cell) MT includes a control gate and a charge storage layer and stores data in a non-volatile manner. The memory cell transistors MT are connected in series between a source of the select transistor ST1 and a drain of the select transistor ST2.

Gates of the select transistors ST1 in the respective string units SU0 to SU3 are connected to select gate lines SGD0 to SGD3, respectively. In contrast to this, gates of the select transistors ST2 in the respective string units SU0 to SU3 are connected to, for example, one select gate line SGS. Alternatively, the gates of the select transistors ST2 may be connected to different select gate lines SGSO to SGS3 for each string unit. The control gates of memory cell transistors MT0 to MT7 in the string units SU0 to SU3 in block BLK are connected to word lines WL0 to WL7, respectively.

The memory cell array 11 shares bit lines BL0 to BL(m−1) among the plurality of blocks BLK0 to BLKn where, m is a natural number greater than or equal to 2. In the plurality of string units SU0 to SU3 in the block BLK, each bit line BL is commonly connected to drains of the select transistors ST1 of the NAND strings NS in the same column. That is, each bit line BL is commonly connected to the NAND strings NS across the plurality of string units SU0 to SU3 in the same column. Furthermore, the sources of the plurality of select transistors ST2 are commonly connected to a source line SL. That is, one string unit SU includes a plurality of NAND strings NS that are respectively connected to different bit lines BL and are connected to the same select gate line SGD.

One block BLK includes a plurality of string units SU sharing the word lines WL.

The plurality of memory cell transistors MT connected to one common word line WL in one string unit SU are referred to as a cell unit CU. A storage capacity of the cell unit CU changes according to the number of bits of data stored in the memory cell transistor MT. For example, the cell unit CU stores 1-page data when each memory cell transistor MT stores 1-bit data, the cell unit CU stores 2-page data when each memory cell transistor MT stores 2-bit data, and the cell unit CU stores 3-page data when each memory cell transistor MT stores 3-bit data.

A configuration of the memory cell array 11 is not limited to the configuration described above. For example, the string units SU in each block BLK may be set to any number. Each of the memory cell transistors MT and the select gate transistors ST1 and ST2 in each NAND string NS may be set to any number.

Figure 3:
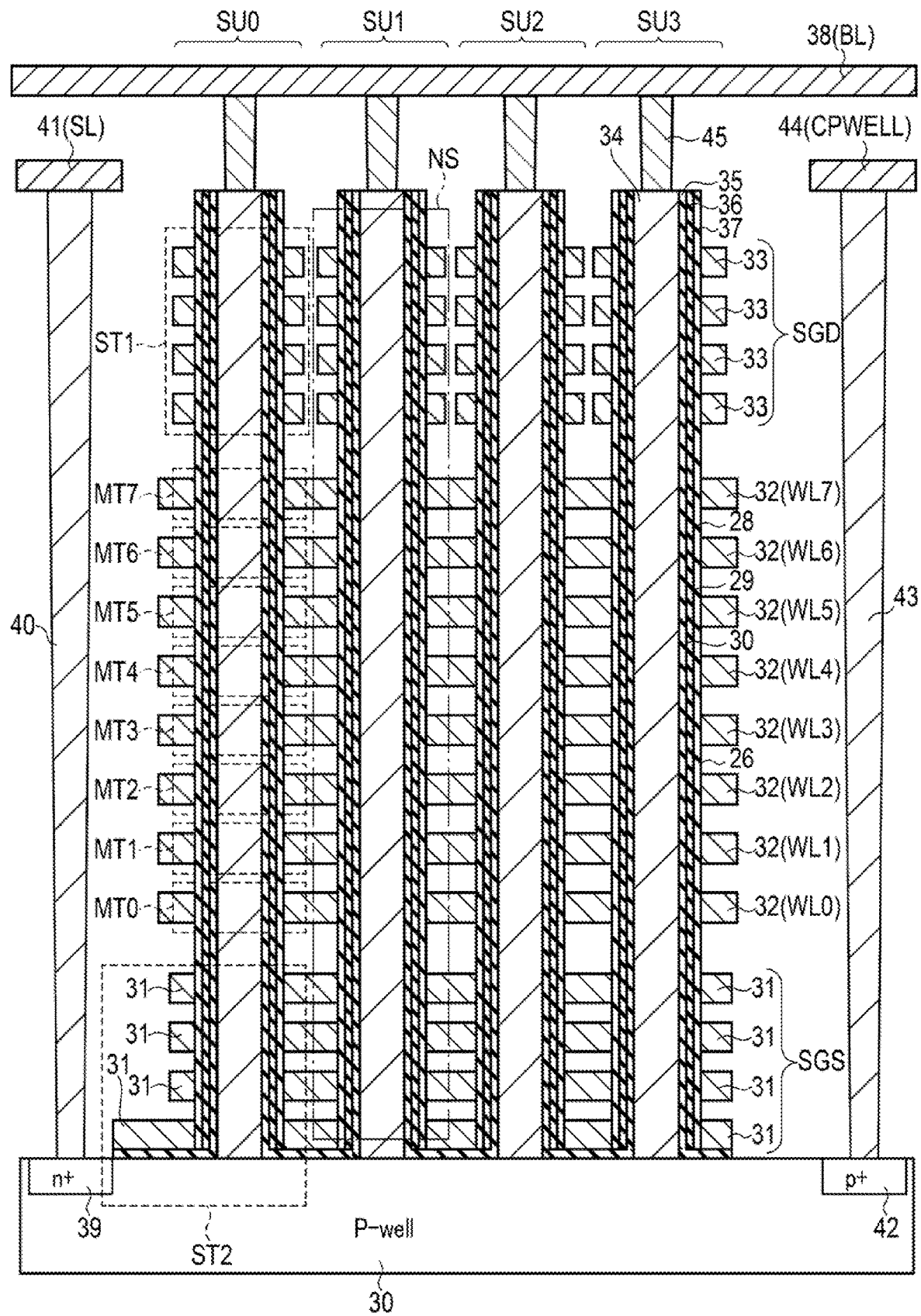
FIG. 3 is a sectional diagram of a partial region of the block according to the first embodiment.

Next, a sectional structure of a partial region of the block BLK will be described. FIG. 3 is a sectional diagram of the partial region of the block BLK. As illustrated, a plurality of NAND strings NS are formed on a p-type well region 30. That is, four wiring layers 31 functioning as the select gate line SGS, eight wiring layers 32 functioning as the word lines WL0 to WL7, and, four wiring layers 33 functioning as the select gate lines SGD are sequentially stacked on the well region 30. An insulating film not illustrated is formed between the stacked wiring layers.

A pillar-shaped semiconductor 34 is formed to penetrate the wiring layers 31, 32, and 33 and reach the well region 30. A gate insulating film 35, a charge storage film (in one example, an insulating film) 36, and a block insulating film 37 are sequentially formed on a side surface of the semiconductor 34. Accordingly, the memory cell transistors MT and the select transistors ST1 and ST2 are formed. The semiconductor 34 functions as a current path of the NAND string NS and is a region where a channel of each transistor is formed. An upper end of the semiconductor 34 is connected to a metal wiring layer 38 functioning as the bit line BL through a contact plug 45.

An $n^+$-type impurity diffusion layer 39 is formed in a surface region of the well region 30. A contact plug 40 is formed on the diffusion layer 39, and the contact plug 40 is connected to a metal wiring layer 41 functioning as the source line SL. Furthermore, a $p^+$-type impurity diffusion layer 42 is formed in a surface region of the well region 30. A contact plug 43 is formed on the diffusion layer 42, and the contact plug 43 is connected to a metal wiring layer 44 functioning as a well wiring CPWELL. The well wiring CPWELL is a line for applying a voltage to the semiconductor 34 through the well region 30.

A plurality of the above-described configurations are arranged in a depth direction (orthogonal to a paper surface in which FIG. 3 is illustrated), and the string unit SU is formed by a set of the plurality of NAND strings NS aligned in the depth direction.

Furthermore, the configuration of the memory cell array 11 may have a different configuration, such as those described in U.S. patent application Ser. No. 12/407,403, filed on Mar. 19, 2009, entitled "THREE DIMENSIONAL STACKED NONVOLATILE SEMICONDUCTOR MEMORY," U.S. patent application Ser. No. 12/406,524, filed on Mar. 18, 2009, entitled "THREE DIMENSIONAL STACKED NONVOLATILE SEMICONDUCTOR MEMORY," U.S. patent application Ser. No. 12/679,991 filed on Mar. 25, 2010, entitled "NON-VOLATILE SEMICONDUCTOR STORAGE DEVICE AND METHOD OF MANUFACTURING THE SAME," and U.S. patent application Ser. No. 12/532,030, filed on Mar. 23, 2009, entitled "SEMICONDUCTOR MEMORY AND METHOD FOR MANUFACTURING SAME." All of these patent applications are hereby incorporated by reference in their entirety.

Data can be erased in units of one block BLK or in units smaller than one block BLK, using an erasure method described in, for example, U.S. patent application Ser. No. 13/235,389, filed on Sep. 18, 2011, entitled "NONVOLATILE SEMICONDUCTOR MEMORY DEVICE," U.S. patent application Ser. No. 12/694,690, filed on Jan. 27, 2010, entitled "NON-VOLATILE SEMICONDUCTOR STORAGE DEVICE," and U.S. patent application Ser. No. 13/483,610, filed on May 30, 2012, entitled "NONVOLATILE SEMICONDUCTOR MEMORY DEVICE AND DATA ERASE METHOD THEREOF." All of these patent applications are incorporated herein by reference in their entirety.

1.1.2 Threshold Voltage Distribution of Memory Cell Transistor

Figure 4:
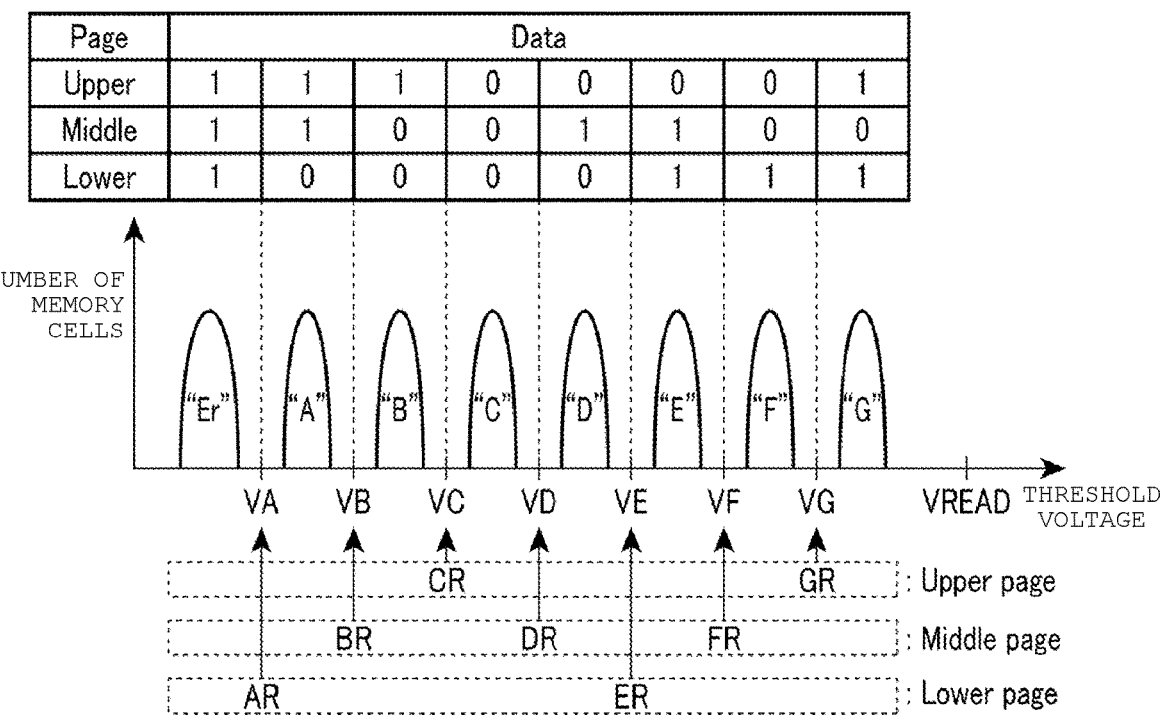
FIG. 4 is a diagram illustrating acquired data of a memory cell transistor and a threshold voltage distribution thereof according to the first embodiment.

FIG. 4 illustrates data stored in the memory cell transistor MT and a threshold voltage distribution thereof according to the first embodiment. Here, a case where the memory cell is programmed with a triple-level cell (TLC) scheme for storing 3-bit data will be described.

As illustrated in FIG. 4, each memory cell transistor MT may store, for example, 3-bit data according to a threshold voltage thereof. The 3-bit data is, for example, "111", "110", "100", "000", "010", "011", "001", and "101" respectively from the data with the lowest threshold voltage. States of the threshold voltage of the memory cell storing the data are, for example, an "Er" state (for example, less than a voltage VA), an "A" state (for example, higher than or equal to the voltage VA, lower than VB, and VA<VB), a "B" state (for example, higher than or equal to the voltage VB, lower than VC, and VB<VC), a "C" state (for example, higher than or equal to the voltage VC, lower than VD, and VC<VD), a "D" state (for example, higher than or equal to the voltage VD, lower than VE, and VD<VE), an "E" state (for example, higher than or equal to the voltage VE, lower than VF, and VE<VF), an "F" state (for example, higher than or equal to the voltage VF, lower than VG, and VF<VG), and a "G" state (for example, higher than or equal to the voltage VG) respectively from the lowest threshold voltage. A relationship between the 3-bit data and the threshold voltage is not limited to the relationships described herein, and the relationship between the two may be selected appropriately.

The 3-bit data stored in each memory cell transistor MT is referred to as a lower bit, a middle bit, and an upper bit. In the same string unit SU, a set of the lower bits stored in the cell unit CU including a plurality of memory cells connected to the same word line is called a lower page, a set of the middle bits is referred to as a middle page, and a set of the upper bits is called an upper page. That is, three pages are allocated to the cell unit CU. Thus, the "page" may be defined as a part of a memory space formed by the cell unit CU.

Writing and reading of data are performed in page units or cell units. In the present example, since one string unit SU includes eight word lines, each string unit SU includes (3×8)=24 pages, and since one block BLK includes four string units SU, each block contains (24×4)=96 pages.

1.1.3 Configuration of Row Decoder, Driver and Voltage Generation Circuit

Next, the configuration of the row decoder 12, the driver 13, and the voltage generation circuit 14 in the semiconductor storage device according to the first embodiment will be described.

The voltage generation circuit 14 supplies the driver with various voltages, which are used for writing, reading and erasing data, such as voltages VUSEL, VSEL, and VSG. The voltage VUSEL is a voltage transferred to the word line WL which is neither a write target nor a read target in the block BLK which is either a data read target or a data write target. The voltage VSEL is a voltage transferred to the word line WL which is either a write target or a read target in the block BLK which is either a data read target or a data write target. The voltage VSG is a voltage transferred to a select gate line of the selected string unit SU in the block BLK which is either a data read target or a data write target. A circuit configuration and an operation of the voltage generation circuit 14 will be described below.

In the following description, when a block, a word line, and a memory cell transistor are a data write target or a data read target, the block, the word line, and the memory cell transistor are referred to as a selected block, a selected word line, and a selected memory cell transistor (or selected memory cell), respectively. When a block, a word line, and a memory cell transistor are not a data write target or a data read target the block, the word line, and the memory cell transistor are referred to as a non-selected block, a non-selected word line, and a non-selected memory cell transistor (or non-selected memory cell), respectively.

1.1.3.1 Row Decoder and Driver

Figure 5:
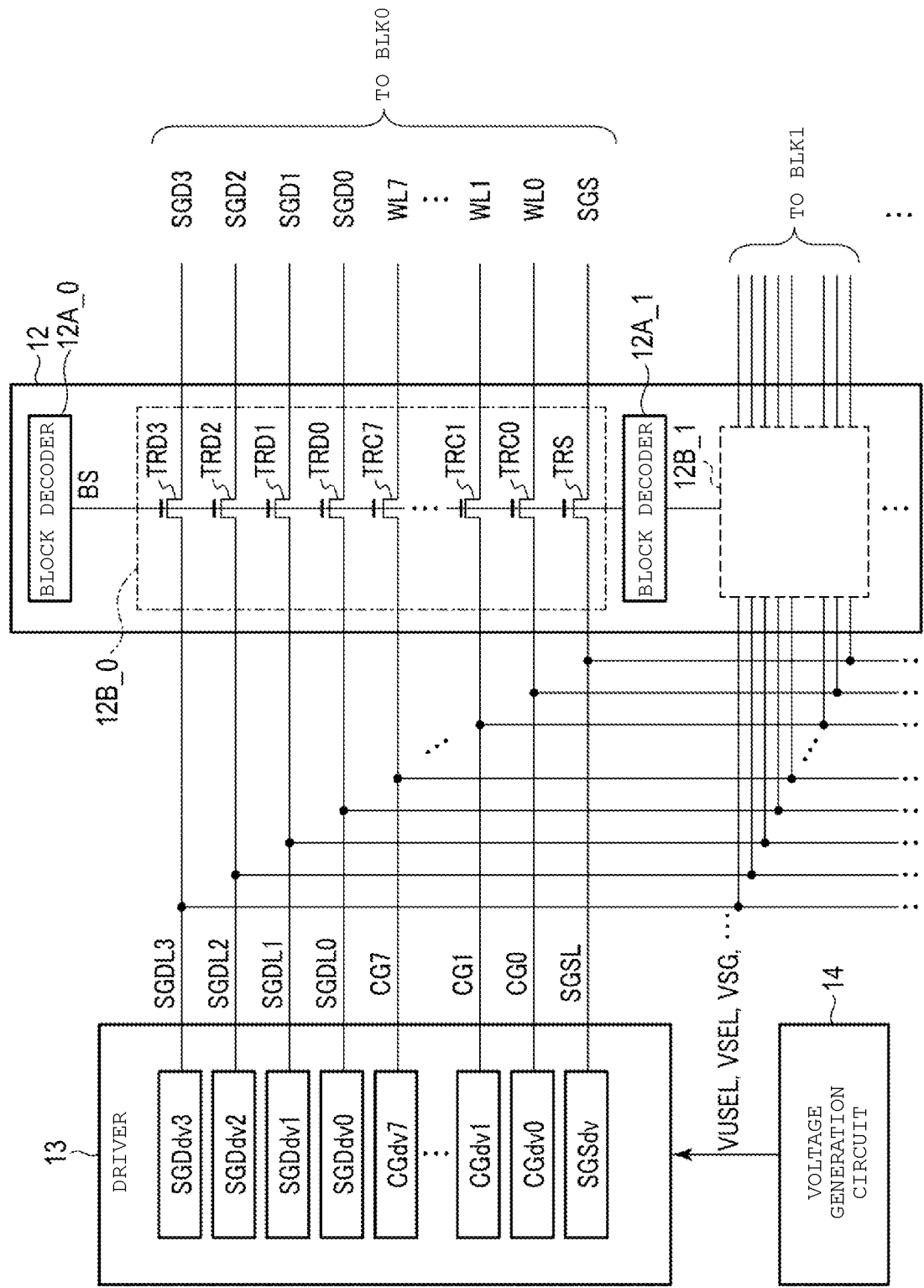
FIG. 5 is a circuit diagram illustrating a configuration of a row decoder and a driver according to the first embodiment.

FIG. 5 is a circuit diagram illustrating a configuration of the row decoder 12 and the driver 13 according to the first embodiment.

The driver 13 includes drivers CGdv0 to CGdv7, drivers SGDdv0 to SGDdv3, and a driver SGSdv. Hereinafter, it is assumed that, when one driver CGdv is described, the driver CGdv indicates each of the drivers CGdv0 to CGdv7, and when one driver SGDdv is described, the driver SGDdv indicates each of the drivers SGDdv0 to SGDdv3. Each of the driver CGdv, the driver SGDdv, and the driver SGSdv can output a voltage supplied from the voltage generation circuit 14 independently. The drivers CGdv0 to CGdv7 drive lines CG0 to CG7, respectively. The drivers SGDdv0 to SGDdv3 drive the lines SGDL0 to SGDL3, respectively. The driver SGSdv drives a line SGSL.

The row decoder 12 includes a plurality of block decoders 12A_0 to 12A_m and a plurality of transfer transistor groups 12B_0 to 12B_m. A set including the block decoder 12A_m and the transfer transistor group 12B_m corresponds to the block BLKm. For example, in the example illustrated in FIG. 5, a set including the block decoder 12A_0 and the transfer transistor group 12B_0 corresponds to the block BLK0, and a set including the block decoder 12A_1 and the transfer transistor group 12B_1 corresponds to the block BLK1. Hereinafter, it is assumed that, when one block decoder 12A is described, the block decoder 12A indicates each of the block decoders 12A_0 to 12A_m, and when one transfer transistor group 12B is described, the transfer transistor group 12B indicates each of the transfer transistor groups 12B_0 to 12B_m.

The block decoders 12A_0 to 12A_m receive a row address signal from the address register 16. The block decoder 12A selected by the row address signal among the block decoders 12A_0 to 12A_m outputs a block select signal BS. The block select signal BS is supplied to gates of a plurality of transfer transistors in the transfer transistor group 12B of the selected block.

The transfer transistor group 12B includes a plurality of transfer transistors TRC0 to TRC7, TRD0 to TRD3, and TRS. The lines CG0 to CG7 are connected to word lines WL0 to WL7 through the transfer transistors TRC0 to TRC7, respectively. The lines SGDL0 to SGDL3 are connected to the select gate lines SGD0 to SGD3 through the transfer transistors TRD0 to TRD3, respectively. Furthermore, the line SGSL is connected to the select gate line SGS through the transfer transistor TRS.

Each of the transfer transistors TRC0 to TRC7 is turned on, for example, when the block select signal BS is supplied to the gate, and transfers voltages supplied to the lines CG0 to CG7 respectively to the word lines WL0 to WL7. Meanwhile, each of the transfer transistors TRC0 to TRC7 is turned off when the block select signal BS is not supplied to the gate, and does not transfer the voltages supplied to the lines CG0 to CG7 respectively to the word lines WL0 to WL7.

Likewise, each of the transfer transistors TRD0 to TRD3 is turned on, for example, when the block select signal BS is supplied to the gate, and transfers voltages supplied to the lines SGDL0 to SGDL3 respectively to the select gate lines SGD0 to SGD3. Meanwhile, each of the transfer transistors TRD0 to TRD3 is turned off, for example, when the block select signal BS is not supplied to the gate, and does not transfer the voltages supplied to the lines SGDL0 to SGDL3 to the select gate lines SGD0 to SGD3. The transfer transistor TRS is turned on, for example, when the block select signal BS is supplied to the gate, and transfers a voltage supplied to the line SGSL to the select gate line SGS. Meanwhile, the transfer transistor TRS is turned off when the block select signal BS is not supplied to the gate, and does not transfer the voltage supplied to the line SGSL to the select gate line SGS.

The voltages VUSEL, VSEL, and VSG supplied from the voltage generation circuit 14 by the driver 13 and the row decoder 12 having the above-described configuration are supplied to each non-selected word line WL, the selected word line WL, and the select gate line SGD of the selected block BLK, respectively, by the block select signal BS.

1.1.3.2 Voltage Generation Circuit

Figure 6:
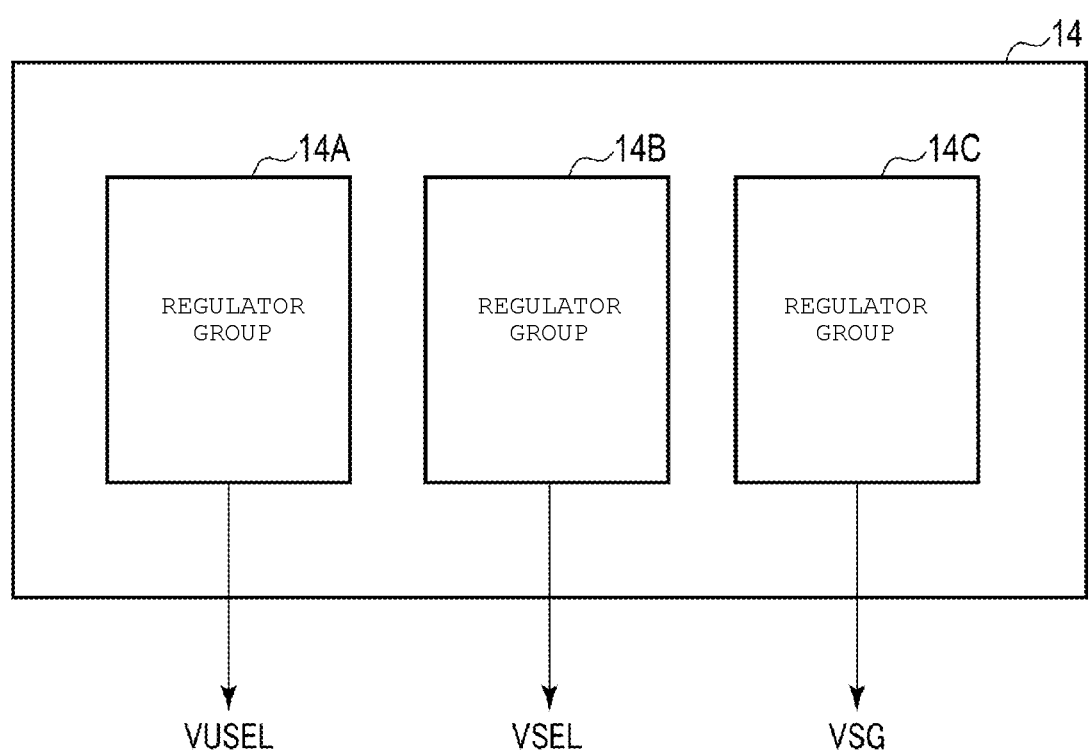
FIG. 6 is a diagram illustrating a configuration of a voltage generation circuit according to the first embodiment.

Next, the voltage generation circuit 14 that supplies various voltages to the driver 13 will be described. FIG. 6 is a diagram illustrating a configuration of the voltage generation circuit 14 according to the first embodiment. The voltage generation circuit 14 includes, for example, a regulator group 14A that generates the voltage VUSEL supplied to each non-selected word line, a regulator group 14B that generates the voltage VSEL supplied to the selected word line, and a regulator group 14C that generates the voltage VSG supplied to the select gate line, during a write operation or a read operation. Here, for example, a case where the regulator group 14A supplies two voltages VOUT1 and VOUT2 to the driver 13 as the voltage VUSEL will be described as an example. In the following description, it is assumed that, when a voltage VOUT is described, the voltage VOUT indicates each of the voltages VOUT1 or VOUT2.

Figure 7:
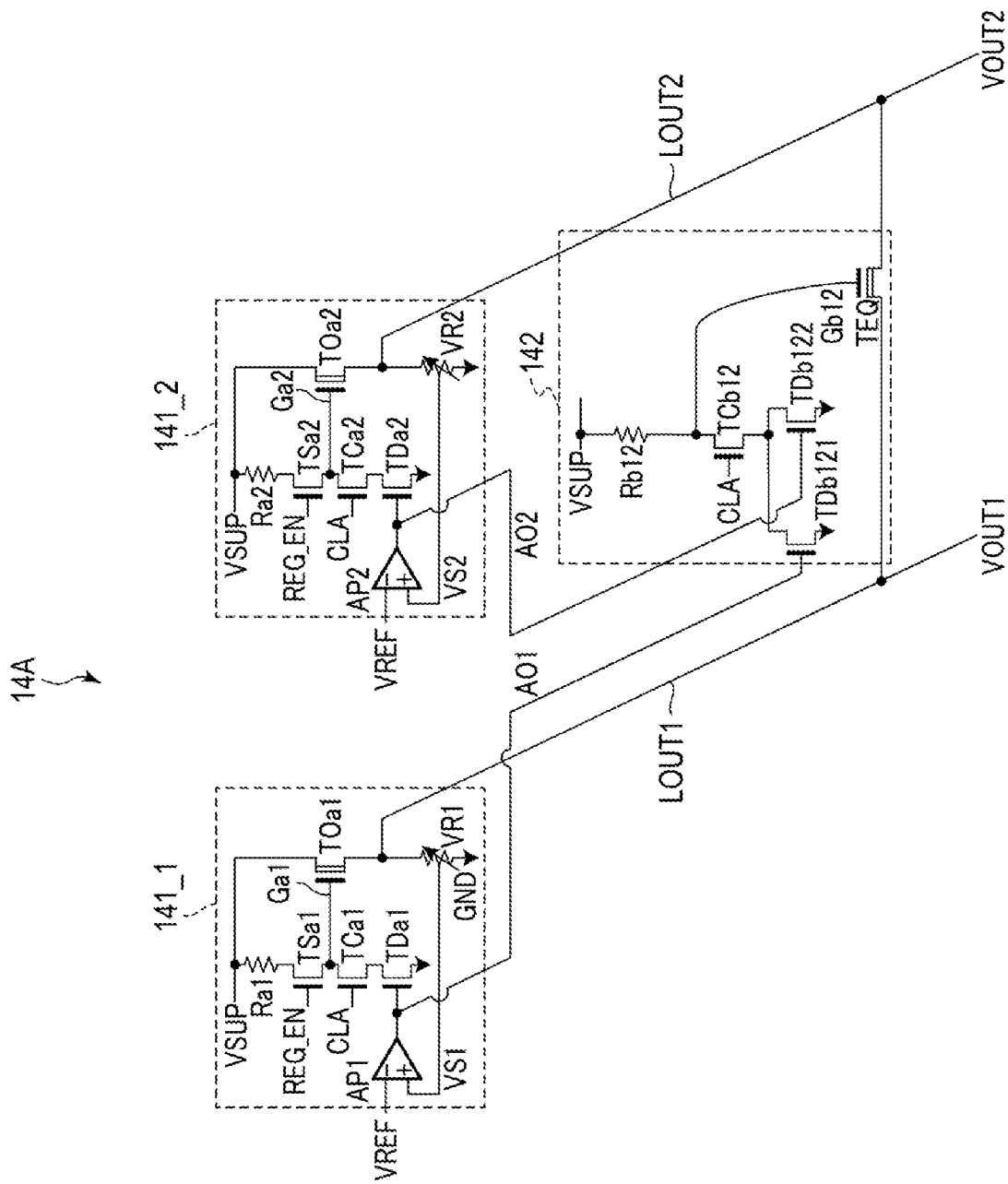
FIG. 7 is a circuit diagram illustrating a configuration of a regulator group according to the first embodiment.

FIG. 7 is a circuit diagram illustrating a configuration of the regulator group 14A according to the first embodiment. The regulator group 14A includes two regulators 141_1 and 141_2, and an equalization circuit (or switch circuit) 142. A voltage VSUP is an input voltage supplied to the regulators 141_1 and 141_2 to generate the voltages VOUT1 and VOUT2.

A circuit connection of the regulator 141_1 will be described below.

The regulator 141_1 includes a low voltage amplification circuit AP1, an n-channel MOS field effect transistor (hereinafter, nMOS transistor) TSa1, TCa1, TDa1, and a depletion type (hereinafter, referred to as a D type) nMOS transistor TOa1, a resistor Ra1, and a variable resistor VR1.

A voltage VSUP is supplied to a drain of the D type nMOS transistor TOa1. A source of the nMOS transistor TOa1 is connected to a ground voltage terminal GND through the variable resistor VR1. A node between the source of the nMOS transistor TOa1 and the variable resistor VR1 is connected to a line LOUT1. The line LOUT1 outputs the voltage VOUT1.

The voltage VSUP is supplied to a drain of the nMOS transistor TSa1 through the resistor Ra1. A source of the nMOS transistor TSa1 is connected to the ground voltage terminal GND through the nMOS transistors TCa1 and TDa1 connected in series. A node between the source of the nMOS transistor TSa1 and a drain of the nMOS transistor TCa1 is connected to a gate of the nMOS transistor TOa1.

A reference voltage VREF is input to an inverting input (−) terminal of the amplification circuit AP1. A resistance control terminal of the variable resistor VR1 is connected to a non-inverting input (+) terminal of the amplification circuit AP1, and a voltage VS1 is input. An output terminal of the amplification circuit AP1 is connected to a gate of the nMOS transistor TDa1. A node between the output terminal of the amplification circuit AP1 and the gate of the nMOS transistor TDa1 is connected to a gate of an nMOS transistor TDb121 of the equalization circuit 142.

Next, a circuit connection of the regulator 141_2 will be described.

The regulator 141_2 includes a low voltage amplification circuit AP2, an nMOS transistors TSa2, TCa2 and TDa2, a D-type nMOS transistor TOa2, a resistor Ra2, and a variable resistor VR2.

The voltage VSUP is supplied to a drain of the D-type nMOS transistor TOa2. A source of the nMOS transistor TOa2 is connected to the ground voltage terminal GND through the variable resistor VR2. A node between the source of the nMOS transistor TOa2 and the variable resistor VR2 is connected to a line LOUT2. The line LOUT2 outputs a voltage VOUT2.

The voltage VSUP is supplied to a drain of the nMOS transistor TSa2 through the resistor Ra2. A source of the nMOS transistor TSa2 is connected to the ground voltage terminal GND through the nMOS transistors TCa2 and TDa2 connected in series. A node between the source of the nMOS transistor TSa2 and the drain of the nMOS transistor TCa2 is connected to a gate of the nMOS transistor TOa2.

The reference voltage VREF is input to an inverting input (−) terminal of the amplification circuit AP2. A resistance control terminal of the variable resistor VR2 is connected to a non-inverting input (+) terminal of the amplification circuit AP2, and a voltage VS2 is input. An output terminal of the amplification circuit AP2 is connected to a gate of the nMOS transistor TDa2. A node between the output terminal of the amplification circuit AP2 and the gate of the nMOS transistor TDa2 is connected to a gate of an nMOS transistor TDb122 of the equalization circuit 142.

Next, circuit connection of the equalization circuit 142 will be described.

The equalization circuit 142 includes nMOS transistors TDb121, TDb122, and TCb12, a D-type nMOS transistor TEQ, and a resistor Rb12. The nMOS transistor TDb121 and the nMOS transistor TDb122 have the same transistor characteristics.

The voltage VSUP is supplied to a drain of the nMOS transistor TCb12 through the resistor Rb12. A node between the drain of the nMOS transistor TCb12 and the resistor Rb12 is connected to a gate of the nMOS transistor TEQ. A source (or drain) of the nMOS transistor TEQ is connected to the line LOUT1, and the drain (or source) of the nMOS transistor TEQ is connected to the line LOUT2. Furthermore, a source of the nMOS transistor TCb12 is connected to the ground voltage terminal GND through the nMOS transistors TDb121 and TDb122 connected in parallel. In other words, the nMOS transistors TDb121 and TDb122 are connected in parallel between the source of the nMOS transistor TCb12 and the ground voltage terminal GND.

The regulators 141_1 and 141_2 and the equalization circuit 142 described above satisfy the following relationships.

[{Rb12·(channel width of TDb12)/(channel length of TDb12)}/{Ra1·(channel width of TDa1)/(channel length of TDa1)}]>1 where Rb12 and Ra1 indicate resistance values of resistors Rb12 and Ra1, respectively, and TDb12 indicates either TDb121 or TDb122.

Ra1=Ra2
(channel width of TDa1)=(channel width of TDa2)
(channel length of TDa1)=(channel length of TDa2)
where Ra2 indicates a resistance value of resistor Ra2.

Figure 8:
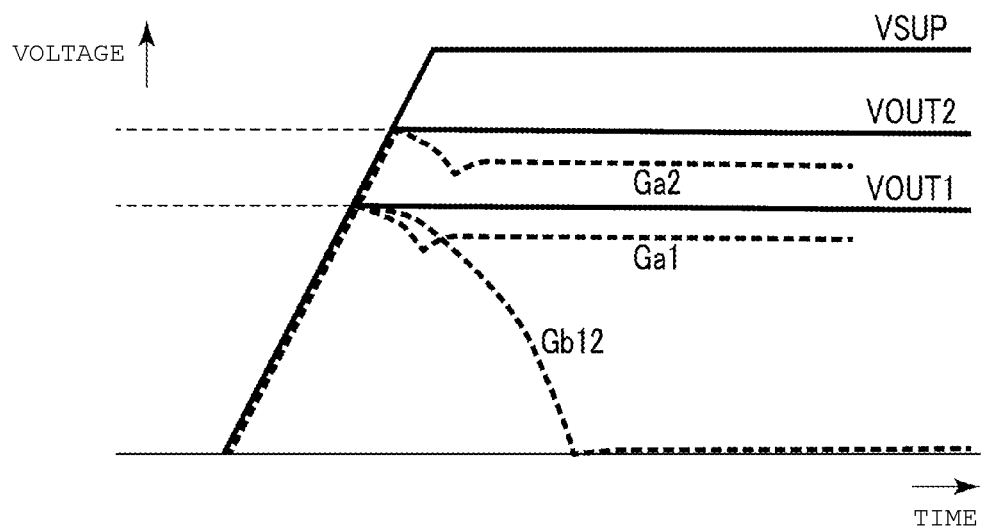
FIG. 8 is a voltage waveform diagram illustrating an operation of the regulator group according to the first embodiment.

Next, an operation of the regulator group 14A according to the first embodiment will be described. FIG. 8 is a voltage waveform diagram illustrating the operation of the regulator group 14A according to the first embodiment.

If an enable signal REG_EN input to the gates of the nMOS transistors TSa1 and TSa2 is asserted (for example, becomes "H"), the nMOS transistors TSa1 and TSa2 are turned on. Thereby, operations of the regulators 141_1 and 141_2 start.

The nMOS transistor TCa1 is a breakdown voltage protection transistor for protecting the nMOS transistor TDa1 from a high voltage. A clamp signal CLA is input to the gate of the nMOS transistor TCa1, and a current flowing through the nMOS transistor TCa1 is limited. Likewise, the nMOS transistor TCa2 is a breakdown voltage protection transistor for protecting the nMOS transistor TDa2 from a high voltage. The clamp signal CLA is input to the gate of the nMOS transistor TCa2, and a current flowing through the nMOS transistor TCa2 is limited. When the nMOS transistors TDa1 and TDa2 are high breakdown voltage transistors, the nMOS transistors TCa1 and TCa2 do not need to be provided.

The voltage VS1 of a resistance control terminal of the variable resistor VR1 is input to the non-inverting input (+) terminal of the amplification circuit AP1, and the reference voltage VREF is input to the inverting input (−) terminal. It is assumed that the reference voltage VREF is, for example, a value (for example, 1.2 V) higher than a ground voltage. The amplification circuit AP1 amplifies a voltage difference between the voltage VS1 and the reference voltage VREF and outputs a voltage AO1. The voltage AO1 continuously changes according to a change of the voltage VS1 (or the voltage VOUT1).

The voltage AO1 output from the amplification circuit AP1 is input to the gate of the nMOS transistor TDa1 and the gate of the nMOS transistor TDb121. The nMOS transistor TDb121 functions as a pull-down circuit that decreases a gate voltage Gb12 of the nMOS transistor TEQ to "L (for example, ground voltage)".

The voltage VS2 of the resistance control terminal of the variable resistor VR2 is input to the non-inverting input (+) terminal of the amplification circuit AP2, and the reference voltage VREF is input to the inverting input (−) terminal. The amplification circuit AP2 amplifies a voltage difference between the voltage VS2 and the reference voltage VREF and outputs a voltage AO2. The voltage AO2 continuously changes according to a change of the voltage VS2 (or the voltage VOUT2).

The voltage AO2 output from the amplification circuit AP2 is input to the gate of the nMOS transistor TDa2 and the gate of the nMOS transistor TDb122. The nMOS transistor TDb122 functions as a pull-down circuit that decreases a gate voltage Gb12 of the nMOS transistor TEQ to "L".

The variable resistor VR1 can set a final arrival voltage (or target voltage) of the voltage VOUT1, and the variable resistor VR2 can set a final arrival voltage (or target voltage) of the voltage VOUT2. Therefore, the variable resistors VR1 and VR2 are set such that the voltage VOUT1 and the voltage VOUT2 are respectively boosted to the target voltages.

In the configuration described above, if operations of the regulators 141_1 and 141_2 start, the D-type nMOS transistor TEQ is turned on, and thereby, the voltage VOUT1 and the voltage VOUT2 increase to the same voltage with the same slope, as illustrated in FIG. 8. Then, the voltage VOUT1 and the voltage VOUT2 reach the target voltage of the voltage VOUT1. If the voltage VOUT1 reaches the target voltage, the voltage AO1 from the amplification circuit AP1 becomes "H", and the nMOS transistors TDa1 and TDb121 are turned on. As a result, the gate voltage Gb12 of the nMOS transistor TEQ decreases, and the nMOS transistor TEQ is turned off. Accordingly, a connection between the line LOUT1 and the line LOUT2 transitions from a connection state to a disconnection state.

Thereafter, the voltage VOUT2 continuously increases to reach a target voltage. If the voltage VOUT2 reaches the target voltage, the voltage AO2 output from the amplification circuit AP2 becomes "H", and the nMOS transistor TDa2 is turned on.

The gate voltage Ga1 of the nMOS transistor TOa1 becomes constant at a voltage lower than the voltage VOUT1 after reaching the voltage VOUT1. The gate voltage Ga2 of the nMOS transistor TOa2 becomes constant at a voltage lower than the voltage VOUT2 after reaching the voltage VOUT2. The gate voltage Gbl2 of the nMOS transistor TEQ gradually decreases to "L" after reaching the voltage VOUT1.

1.2 Effect of First Embodiment

According to the first embodiment, it is possible to provide a semiconductor storage device capable of increasing an operation speed.

An effect of the first embodiment will be described in detail below. Generally, in a semiconductor storage device in which memory cells are three-dimensionally arranged, load capacitance of the word line WL connected to a gate of a memory cell transistor is large. As the generation of semiconductor storage devices advances and the number of stacked memory cells and the mounting memory capacity increase, a load capacitance of the word line WL tends to increase. Accordingly, in order to increase a voltage of the word line to a target voltage, a larger drive current is required.

For example, when the voltage VOUT1 and the voltage VOUT2 higher than the voltage VOUT1 are supplied from a regulator of the voltage generation circuit to the word line, a first line through which the voltage VOUT1 is transferred and a second line through the voltage VOUT2 is transferred enter a conduction state, and the voltage VOUT1 and the voltage VOUT2 are increased with the same voltage and with the same slope, in order to stably increase the voltages VOUT1 and VOUT2, during a period in which the voltage VOUT1 is increased to the target voltage. If the voltage VOUT1 reaches the target voltage, the first line is disconnected from the second line, and thereafter, the voltage VOUT2 is increased to a target voltage. Hereinafter, an operation of bringing the first line and the second line into a conduction state is referred to as an equalization operation.

When the voltage VOUT1 which is the target voltage supplied by the regulator 141_1 is lower than the voltage VOUT2 which is the target voltage supplied by the regulator 141_2, it is preferable that the equalization operation is continuously performed until voltages of the first line and the second line reach the voltage VOUT1 during a period in which the voltage VOUT1 and the voltage VOUT2 are increased, and immediately ends after the voltages of the first line and the second line reach the voltage VOUT1.

For example, it is conceivable to mount a comparator for measuring the voltages of the first line and the second line separately from the regulators 141_1 and 141_2, and to manage end timing of the equalization operation during a period in which the voltage VOUT1 and the voltage VOUT2 are boosting, based on an output of the comparator.

Generally, in the equalization operation using the output of the comparator, it is necessary to provide a non-detection region for a signal input to the comparator in order to avoid a false detection. If the non-detection region is set to be large, the equalization operation may end at too fast timing during the period in which the voltage VOUT1 and the voltage VOUT2 are boosting. Meanwhile, if the non-detection region is set to be small, the equalization operation may not end at an appropriate timing.

In the equalization operation using the output of the comparator, a gate of a switch circuit which performs the equalization operation is turned off digitally by an output of the comparator. At this time, since a load capacitance of a word line is large, a charging load of the word line can cause a delay in increasing to a voltage waveform of the voltage VOUT1, resulting in a dent of the voltage waveform, and the like immediately after an end of the equalization operation.

Therefore, the first embodiment includes the regulator 141_1 that outputs the voltage VOUT1 to the line LOUT1, the regulator 141_2 that outputs the voltage VOUT2 to the line LOUT2, and the equalization circuit (or a switch circuit) 142 that holds the line LOUT1 and the line LOUT2 in a connection state or a disconnection state. The regulator 141_1 outputs the voltage AO1 according to the voltage VOUT1, and the regulator 141_2 outputs the voltage AO2 according to the voltage VOUT2. The equalization circuit 142 holds either the connection state or the disconnection state, based on a signal of at least one of the voltages AO1 or AO2 output from regulator 141_1 or 141_2.

The voltage AO1 or AO2 output from the regulator 141_1 or 141_2 is a continuously changing analog signal, unlike a digital signal output from the comparator. In the first embodiment, the equalization operation can be continued until the voltage VOUT1 substantially reaches a target voltage by switching the connection state and the disconnection state in the equalization circuit 142 based on the voltage AO1 or AO2 which is an analog signal and it is possible to prevent the boosting of the voltage VOUT2 to the target voltage to be hindered.

That is, in the first embodiment, since an analog signal output from the regulator is directly input to the equalization circuit as a detection signal for ending the equalization operation, the equalization operation can be continued during a period in which the equalization operation is required, and the equalization operation can be ended at the timing when the equalization operation is not required.

As described above, in the equalization operation using the output of the comparator, a gate of the switch circuit that performs the equalization operation is turned off digitally by the output of the comparator, and thereby, a charging load of the word line can cause a delay in increasing to a voltage waveform of the voltage VOUT1, resulting in a dent of the voltage waveform, and the like immediately after an end of the equalization operation.

In contrast to this, in the first embodiment, since the equalization operation can be ended at an appropriate timing by a continuously changing analog signal, it is possible to reduce generation of a delay in increasing to a voltage waveform of the voltage VOUT1 output from the regulator 141_1 and generation of a dent.

As described above, according to the semiconductor storage device of the first embodiment, it is possible to supply a voltage required for an operation of writing, reading, and the like of data stably and early, and thereby, an operation speed can be increased.

2. Second Embodiment

Next, a semiconductor storage device according to the second embodiment will be described. In the second embodiment, an equalization end determination circuit is added to the equalization circuit according to the first embodiment illustrated in FIG. 7. In the second embodiment, a point different from the first embodiment will be mainly described.

2.1 Voltage Generation Circuit

Figure 9:
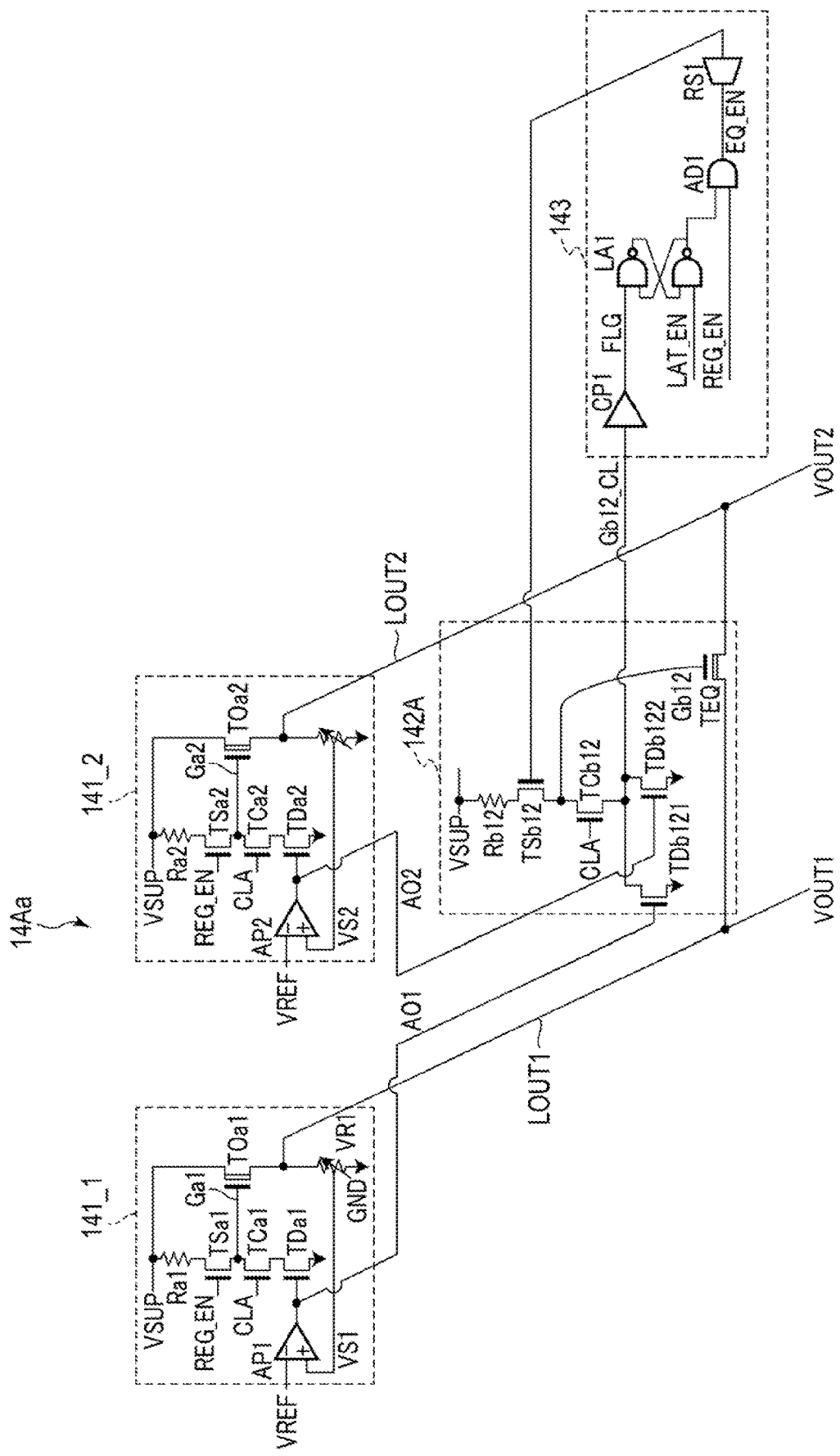
FIG. 9 is a circuit diagram illustrating a configuration of a regulator group according to a second embodiment.

A voltage generation circuit 14 according to the second embodiment includes a regulator group 14Aa. FIG. 9 is a circuit diagram illustrating a configuration of the regulator group 14Aa according to the second embodiment. The regulator group 14Aa includes two regulators 141_1 and 141_2, an equalization circuit 142A, and an equalization end determination circuit 143.

A circuit connection of the equalization circuit 142A will be described below.

An nMOS transistor TSb12 is connected between a drain of the nMOS transistor TCb12 and one terminal of the resistor Rb12. The voltage VSUP is supplied to the other terminal of the resistor Rb12.

Next, a circuit connection of the equalization end determination circuit 143 will be described.

The equalization end determination circuit 143 includes a comparator (or level shifter) CP1, a latch circuit LA1, a logical product circuit (AND circuit) AD1, and a level shifter RS1. A node between drains of the nMOS transistors TDb121 and TDb122 and a source of the nMOS transistor TCb12 is connected to an input terminal of the comparator CP1. An output terminal of the comparator CP1 is connected to a first input terminal of the latch circuit LA1, and a latch enable signal LAT_EN is input to a second input terminal of the latch circuit LA1. An output terminal of the latch circuit LA1 is connected to a first input terminal of the logical product circuit AD1. An enable signal REG_EN is input to a second input terminal of the logical product circuit AD1. An output terminal of the logical product circuit AD1 is connected to an input terminal of the level shifter RS1. Furthermore, an output terminal of the level shifter RS1 is connected to a gate of the nMOS transistor TSb12.

Here, a signal Gb12_CL is a voltage input to the input terminal of the comparator CP1 from a node between drains of the nMOS transistors TDb121 and TDb122 and a source of the nMOS transistor TCb12. A signal FLG is a voltage from the output terminal of the comparator CP1 that is input to the first input terminal of the latch circuit LA1. The latch enable signal LAT_EN is a voltage input to the second input terminal of the latch circuit LA1. The enable signal REG_EN is a signal input to the second input terminal of the logical product circuit AD1. An equalization end signal EQ_EN is a voltage from the output terminal of the logical product circuit AD1 that is input to the input terminal of the level shifter RS1. The other circuit connection of the regulator group 14Aa is the same as the circuit illustrated in FIG. 7.

Figure 10:
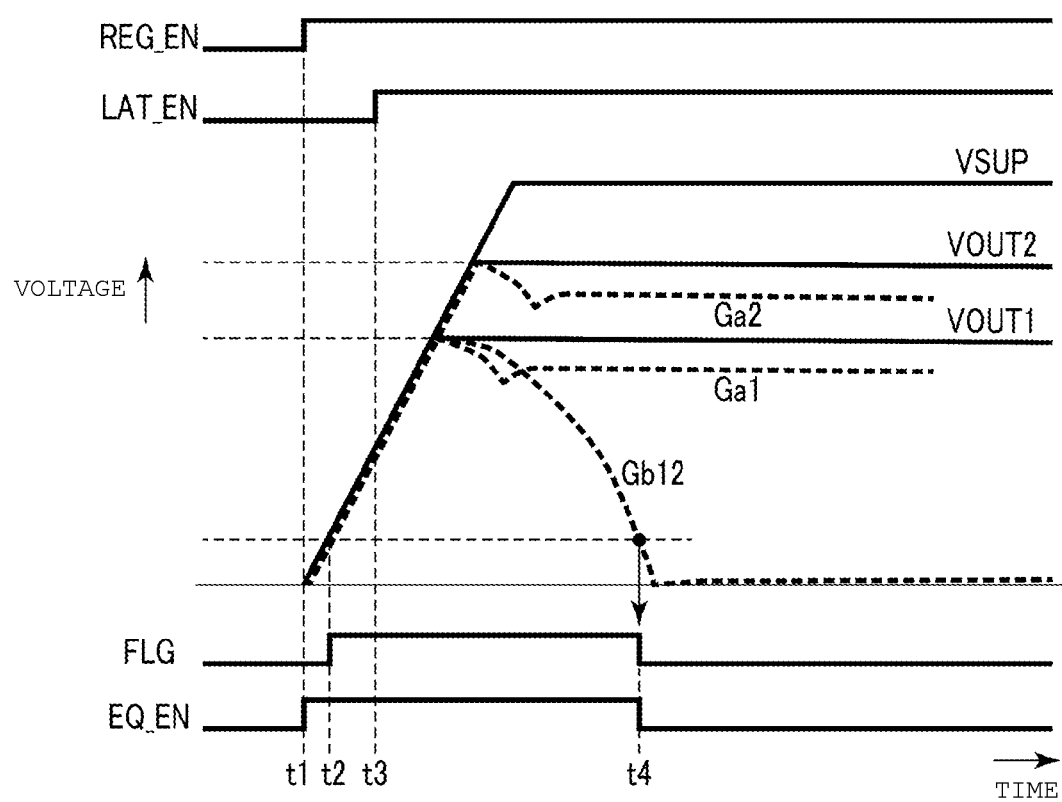
FIG. 10 is a voltage waveform diagram illustrating an operation of the regulator group according to the second embodiment.

Next, an operation of the regulator group 14Aa according to the second embodiment will be described. FIG. 10 is a voltage waveform diagram illustrating the operation of the regulator group 14Aa according to the second embodiment.

First, at time t1, the enable signal REG_EN input to the gates of the nMOS transistors TSa1 and TSa2 is set to an assertion state (for example, "H"), and the nMOS transistors TSa1 and TSa2 are turned on. Thereby, operations of the regulators 141_1 and 141_2 starts. Furthermore, the enable signal REG_EN input to the second input terminal of the logical product circuit AD1 is set to the assertion state (for example, "H") to start the operation of the equalization end determination circuit 143.

Next, the voltage VOUT1, the voltage VOUT2, and the gate voltage Gb12 increase, and at time t2, the flag signal FLG transitions from "L" to "H". Furthermore, at time t3, the latch enable signal LAT_EN input to the second input terminal of the latch circuit LA1 transitions from "L" to "H".

Thereafter, if the voltage VOUT1 reaches a target voltage, the nMOS transistors TDa1 and TDb121 are turned on. As a result, the gate voltage Gb12 of the nMOS transistor TEQ decreases, the nMOS transistor TEQ is turned off, and a connection state between the line LOUT1 and the line LOUT2 transitions to a disconnection state. At time t4, the flag signal FLG transitions from "H" to "L". If the flag signal FLG transitions to "L", the equalization end signal EQ_EN transitions from "H" to "L".

Thereafter, the equalization end signal EQ_EN ("L") is input to the gate of the nMOS transistor TSb12 through the level shifter RS1. As a result, the nMOS transistor TSb12 is turned off to block a current flowing into the resistor Rb12. The other operations are the same as in the first embodiment described above.

2.2 Effect of Second Embodiment

According to the second embodiment, it is possible to provide a semiconductor storage device capable of increasing an operation speed as in the first embodiment described above.

Furthermore, the second embodiment includes an equalization end determination circuit 143 and the nMOS transistor TSb12 provided in the equalization circuit 142A. The equalization end determination circuit 143 detects an end of the equalization operation of the equalization circuit 142A and outputs the equalization end signal EQ_EN. The equalization operation brings the line LOUT1 and the line LOUT2 into a connection state (or a conduction state).

When equalization end determination circuit 143 detects an end of the equalization operation, that is, when the nMOS transistor TEQ is turned off, the equalization end signal EQ_EN input to the gate of nMOS transistor TSb12 transitions from "H" to "L". As a result, the nMOS transistor TSb12 is turned off to block a current flowing through the resistor Rb12. That is, in the second embodiment, immediately after the voltage VOUT1 increases to a target voltage, the equalization operation of the equalization circuit 142A can be stopped to reduce the current flowing through the resistor Rb12. The other effect is the same as in the first embodiment described above.

3. Third Embodiment

Next, a semiconductor storage device of a third embodiment will be described. In the first and second embodiments, a case where two voltages VOUT1 and VOUT2 are generated as the voltage VUSEL is described, and in the third embodiment, a case where three voltages VOUT1, VOUT2, and VOUT3 are generated is described. Hereinafter, when the voltage VOUT is described, the voltage VOUT indicates each of the voltages VOUT1, VOUT2, and VOUT3. Furthermore, a regulator group according to the third embodiment includes an equalization end determination circuit. In the third embodiment, a point different from the second embodiment will be mainly described.

3.1 Voltage Generation Circuit

Figure 11:
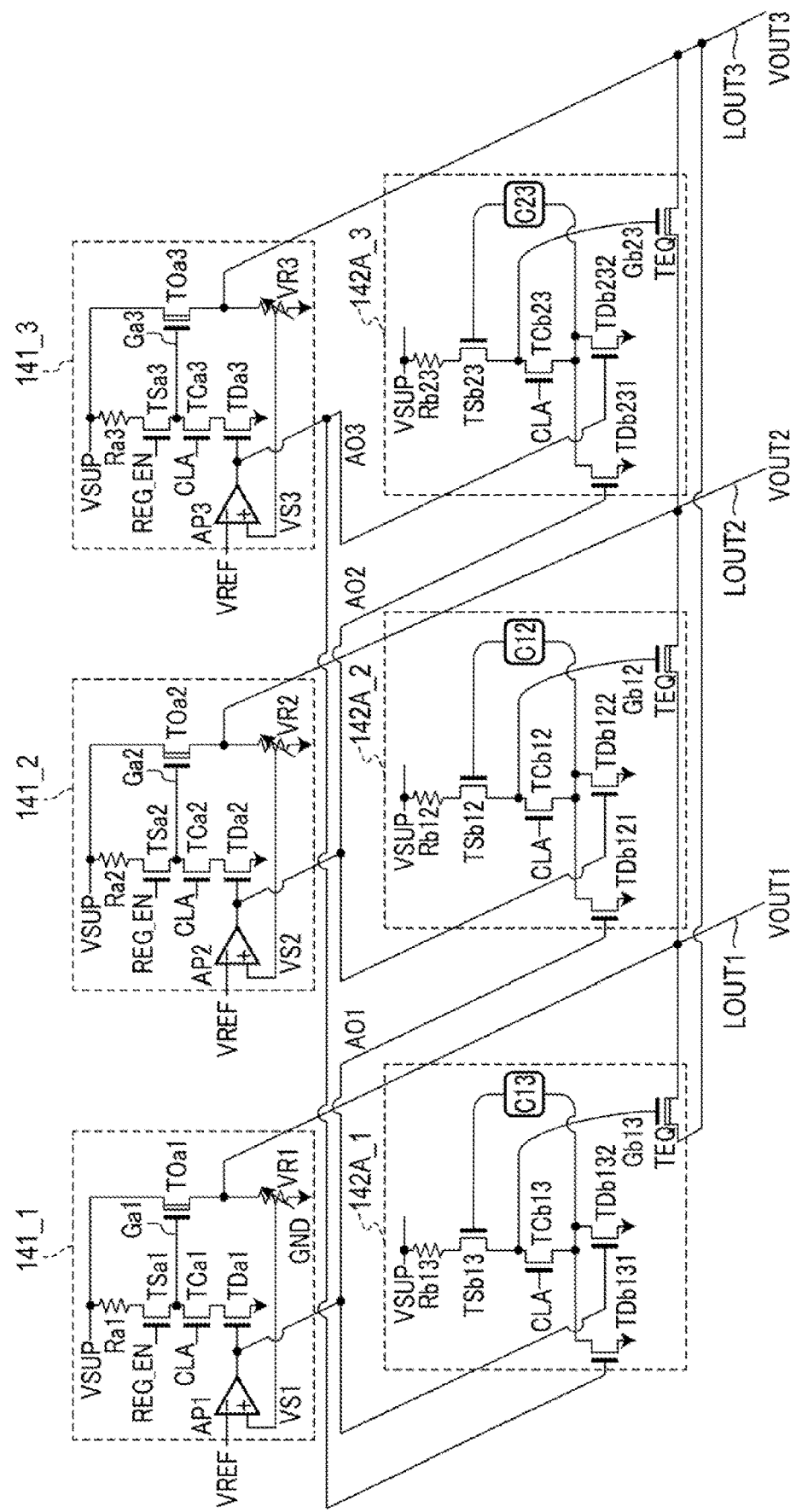
FIG. 11 is a circuit diagram illustrating a configuration of a regulator group according to a third embodiment.

A voltage generation circuit 14 according to the third embodiment includes a regulator group 14Ab. FIG. 11 is a circuit diagram illustrating a configuration of the regulator group 14Ab according to the third embodiment. The regulator group 14Ab includes three regulators 141_1, 141_2, and 141_3, equalization circuits 142A_1, 142A_2, and 142A_3, and equalization end determination circuits C13, C12, and C23.

As illustrated in FIG. 11, the voltage AO1 output from the amplification circuit AP1 is connected to a gate of an nMOS transistor TDb132 of an equalization circuit 142A_1 and to a gate of an nMOS transistor TDb121 of the equalization circuit 142A_2. The voltage AO2 output from the amplification circuit AP2 is connected to a gate of an nMOS transistor TDb122 of the equalization circuit 142A_2 and to a gate of an nMOS transistor TDb231 of the equalization circuit 142A_3. Furthermore, the output voltage AO3 of the amplification circuit AP3 is connected to a gate of an nMOS transistor TDb131 of the equalization circuit 142A_1 and to a gate of an nMOS transistor TDb232 of the equalization circuit 142A_3.

The equalization end determination circuit C13 is connected between drains of the nMOS transistors TDb131 and TDb132 and a gate of the nMOS transistor TSb13. The equalization end determination circuit C12 is connected between drains of the nMOS transistors TDb121 and TDb122 and a gate of the nMOS transistor TSb12. The equalization end determination circuit C23 is connected between drains of the nMOS transistors TDb231 and TDb232 and a gate of the nMOS transistor TSb23.

Furthermore, nMOS transistors TOa1, TOa2, and TOa3 of the regulators 141_1, 141_2, and 141_3 output the voltages VOUT1, VOUT2, and VOUT3 through the lines LOUT1, LOUT2 and LOUT3, respectively.

The regulator group 14Ab illustrated in FIG. 10 satisfy the following relationships.

[{Rb12·(channel width of TDb12)/(channel length of TDb12)}/{Ra1·(channel width of TDa1)/(channel length of TDa1)}]>1 where Rb12 and Ra1 indicate resistance values of resistors Rb12 and Ra1, respectively, and TDb12 indicates either TDb121 or TDb122.

Ra1=Ra2=Ra3
(channel width of TDa1)=(channel width of TDa2)=
    (channel width of TDa3)
(channel length of TDa1)=(channel length of TDa2)=
    (channel length of TDa3)
Rb13=Rb12=Rb23
(channel width of TDb13)=(channel width of TDb12)=
    (channel width of TDb23)
(channel length of TDb13)=(channel length of TDb12)=
    (channel length of TDb23)

where Ra2, Ra3, Rb13, Rb12, and Rb23 indicate resistance values of resistors Ra2, Ra3, Rb13, Rb12, and Rb23, respectively, and TDb13 indicates either TDb131 or TDb132, TDb12 indicates either TDb121 or TDb122, and TDb23 indicates either TDb231 or TDb232.

The regulator group 14Ab according to the third embodiment is obtained by applying the regulator group 14Aa which generates the two voltages VOUT1 and VOUT2 illustrated in FIG. 9 to a circuit which generates the three voltages VOUT1, VOUT2, and VOUT3, and description on an operation of the regulator group 14Ab will be omitted.

3.2 Another Configuration Example of Voltage Generation Circuit

Next, another configuration example of the regulator group 14Ab in the voltage generation circuit 14 according to the third embodiment will be described. The voltage generation circuit 14 according to the third embodiment includes a regulator group 14Ac or 14Ad.

3.2.1 Regulator Group 14Ac

Figure 12:
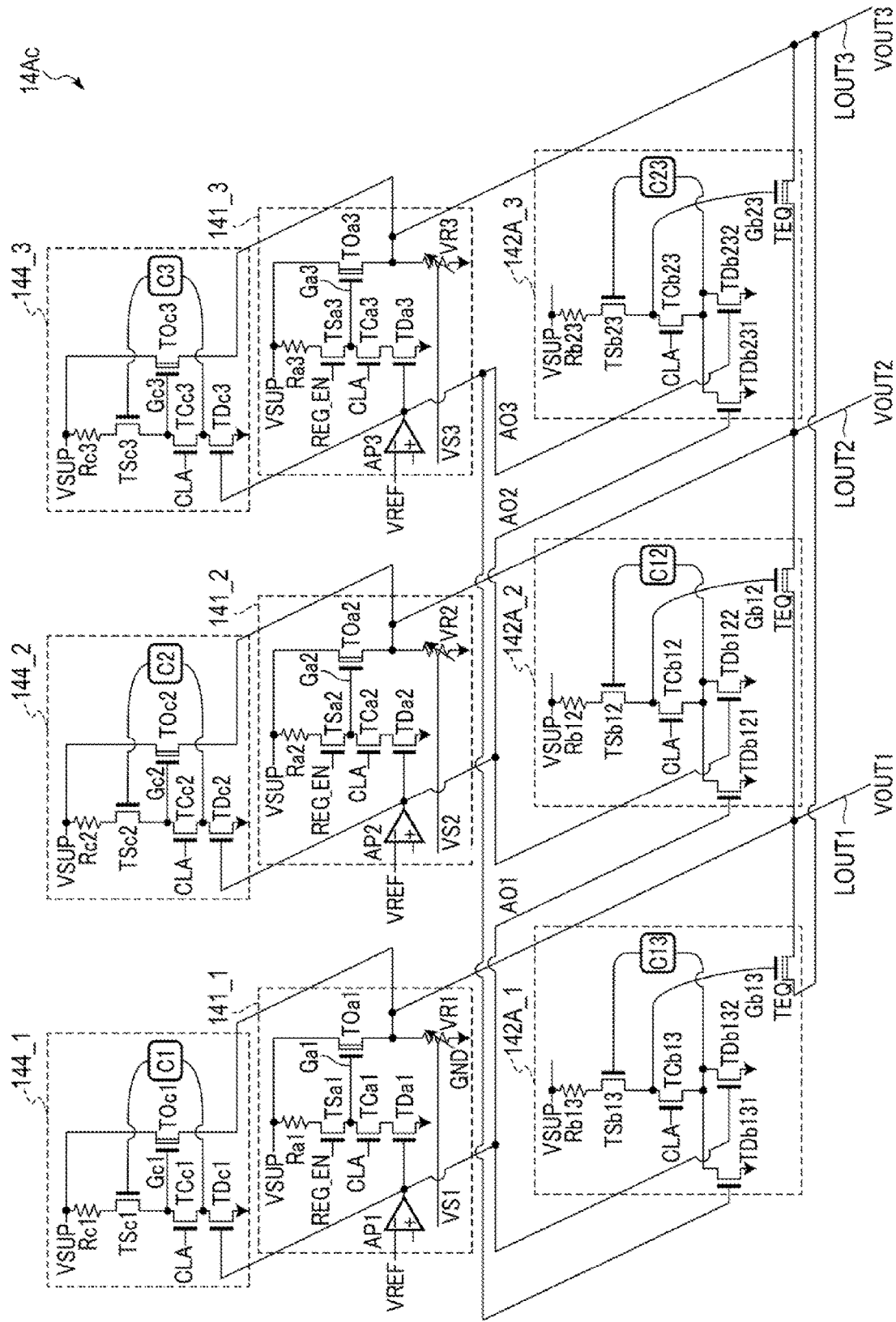
FIG. 12 is a circuit diagram illustrating another first configuration example of the regulator group according to the third embodiment.

FIG. 12 is a circuit diagram illustrating a configuration of the regulator group 14Ac. The regulator group 14Ac is obtained by adding drive circuits 144_1, 144_2, and 144_3 for driving the voltages VOUT1, VOUT2, and VOUT3 to the regulator group 14Ab described above.

As illustrated in FIG. 12, the drive circuits 144_1, 144_2, and 144_3 are added to the regulators 141_1, 141_2, and 141_3, respectively. The drive circuit 144_1 includes nMOS transistors TSc1, TCc1, and TDc1, a D-type nMOS transistor TOc1, a ramp-up end determination circuit C1, and a resistor Rc1. The drive circuit 144_2 includes nMOS transistors TSc2, TCc2 and TDc2, a D-type nMOS transistor TOc2, a ramp-up end determination circuit C2, and a resistor Rc2. Furthermore, the drive circuit 144_3 includes nMOS transistors TSc3, TCc3 and TDc3, a D-type nMOS transistor TOc3, a ramp-up end determination circuit C3, and a resistor Rc3. Hereinafter, when one drive circuit 144 is described, the drive circuit 144 indicates each of the drive circuits 144_1, 144_2, and 144_3.

A circuit connection of the drive circuit 144_1 will be described below.

The voltage VSUP is supplied to a drain of the D-type nMOS transistor TOc1. A source of the nMOS transistor TOc1 is connected to the line LOUT1.

The voltage VSUP is supplied to a drain of the nMOS transistor TSc1 through the resistor Rc1. A source of the nMOS transistor TSc1 is connected to the ground voltage terminal GND through the nMOS transistors TCc1 and TDc1 connected in series. A node between the source of the nMOS transistor TSc1 and a drain of the nMOS transistor TCc1 is connected to a gate of the nMOS transistor TOc1. Furthermore, a gate of the nMOS transistor TDc1 is connected to an output terminal of the amplification circuit AP1.

The ramp-up end determination circuit C1 has the same circuit configuration as the above-described equalization end determination circuit 143. A node between the source of the nMOS transistor TCc1 and the drain of the nMOS transistor TDc1 is connected to an input terminal of the comparator CP1 of the ramp-up end determination circuit C1. An output terminal of the level shifter RS1 of the ramp-up end determination circuit C1 is connected to a gate of the nMOS transistor TSc1.

Next, a circuit connection of the drive circuit 144_2 will be described.

The voltage VSUP is supplied to a drain of the D-type nMOS transistor TOc2. A source of the nMOS transistor TOc2 is connected to the line LOUT2.

The voltage VSUP is supplied to a drain of the nMOS transistor TSc2 through the resistor Rc2. A source of the nMOS transistor TSc2 is connected to the ground voltage terminal GND through the nMOS transistors TCc2 and TDc2 connected in series. A node between the source of the nMOS transistor TSc2 and a drain of the nMOS transistor TCc2 is connected to a gate of the nMOS transistor TOc2. Furthermore, a gate of the nMOS transistor TDc2 is connected to an output terminal of the amplification circuit AP2.

The ramp-up end determination circuit C2 has the same circuit configuration as the equalization end determination circuit 143. A node between a source of the nMOS transistor TCc2 and a drain of the nMOS transistor TDc2 is connected to an input terminal of the comparator CP1 of the ramp-up end determination circuit C2. An output terminal of the level shifter RS1 of the ramp-up end determination circuit C2 is connected to a gate of the nMOS transistor TSc2.

Next, a circuit connection of the drive circuit 144_3 will be described.

The voltage VSUP is supplied to a drain of the D-type nMOS transistor TOc3. A source of the nMOS transistor TOc3 is connected to the line LOUT3.

The voltage VSUP is supplied to a drain of the nMOS transistor TSc3 through the resistor Rc3. A source of the nMOS transistor TSc3 is connected to the ground voltage terminal GND through the nMOS transistors TCc3 and TDc3 connected in series. A node between the source of the nMOS transistor TSc3 and a drain of the nMOS transistor TCc3 is connected to a gate of the nMOS transistor TOc3. Furthermore, a gate of the nMOS transistor TDc3 is connected to an output terminal of the amplification circuit AP3.

The ramp-up end determination circuit C3 has the same circuit configuration as the equalization end determination circuit 143. A node between the source of the nMOS transistor TCc3 and the drain of the nMOS transistor TDc3 is connected to an input terminal of the comparator CP1 of the ramp-up end determination circuit C3. An output terminal of the level shifter RS1 of the ramp-up end determination circuit C3 is connected to a gate of the nMOS transistor TSc3.

The other circuit configuration of the regulator group 14Ac is the same as the circuit configuration of the regulator group 14Ab illustrated in FIG. 11.

Next, an operation of the regulator group 14Ac will be described.

The drive circuit 144_1 operates during a period in which the voltage VOUT1 increases to a target voltage, and drives the line LOUT1. As a result, the voltage VOUT1 reaches the target voltage in a shorter time as compared with the first and second embodiments. Likewise, the drive circuits 144_2 and 144_3 operate during periods in which the voltage VOUT2 and the voltage VOUT3 increase to target voltages and drive the lines LOUT2 and LOUT3. As a result, the voltages VOUT2 and VOUT3 reach the target voltages in a shorter time as compared with the first embodiment and the second embodiment.

If the voltage VOUT1 reaches the target voltage, the voltage AO1 from the amplification circuit AP1 becomes "H", and the nMOS transistor TDc1 is turned on. As a result, the gate voltage Gc1 of the nMOS transistor TOc1 decreases, and the nMOS transistor TOc1 is turned off. Accordingly, boosting of the voltage VOUT1 by the drive circuit 144_1 stops.

The ramp-up end determination circuit C1 of the drive circuit 144_1 detects whether or not the voltage VOUT1 reaches the target voltage, and asserts or negates the ramp end signal RUP EN1. That is, if the voltage VOUT1 reaches the target voltage, the ramp-up end determination circuit C1 outputs the asserted ramp end signal RUP EN1 (for example, "L") to the gate of the nMOS transistor TSc1. If the nMOS transistor TSc1 receives the ramp end signal RUP EN1 ("L"), the nMOS transistor TSc1 is turned off. As a result, a current flowing through the resistor Rc1 is blocked.

Likewise, if the voltage VOUT2 reaches the target voltage, the voltage AO2 output from the amplification circuit AP2 becomes "H", and the nMOS transistor TDc2 is turned ON. As a result, the gate voltage Gc2 of the nMOS transistor TOc2 decreases, and the nMOS transistor TOc2 is turned off. Accordingly, boosting of the voltage VOUT2 by the drive circuit 144_2 stops.

The ramp-up end determination circuit C2 of the drive circuit 144_2 detects whether or not the voltage VOUT2 reaches the target voltage, and asserts or negates the ramp end signal RUP EN2. That is, if the voltage VOUT2 reaches the target voltage, the ramp-up end determination circuit C2 outputs the asserted ramp end signal RUP EN2 (for example, "L") to the gate of the nMOS transistor TSc2. If the nMOS transistor TSc2 receives the ramp end signal RUP EN2 ("L"), the nMOS transistor TSc2 is turned off. As a result, a current flowing through the resistor Rc2 is blocked.

Likewise, if the voltage VOUT3 reaches the target voltage, the output voltage AO3 from the amplification circuit AP3 becomes "H", and the nMOS transistor TDc3 is turned on. As a result, the gate voltage Gc3 of the nMOS transistor TOc3 decreases, and the nMOS transistor TOc3 is turned off. Accordingly, boosting of the voltage VOUT3 by the drive circuit 144_3 stops.

The ramp-up end determination circuit C3 of the drive circuit 144_3 detects whether or not the voltage VOUT3 reaches the target voltage, and asserts or negates the ramp end signal RUP_EN3. That is, if the voltage VOUT3 reaches the target voltage, the ramp-up end determination circuit C3 outputs the asserted ramp end signal RUP_EN3 (for example, "L") to the gate of the nMOS transistor TSc3. If the nMOS transistor TSc3 receives the ramp end signal RUP_EN3 ("L"), the nMOS transistor TSc3 is turned off. As a result, a current flowing through the resistor Rc3 is blocked.

The other operation of the regulator group 14Ac is the same as the operation of the regulator group 14Ab illustrated in FIG. 11.

3.2.2 Regulator Group 14Ad

Figure 13:
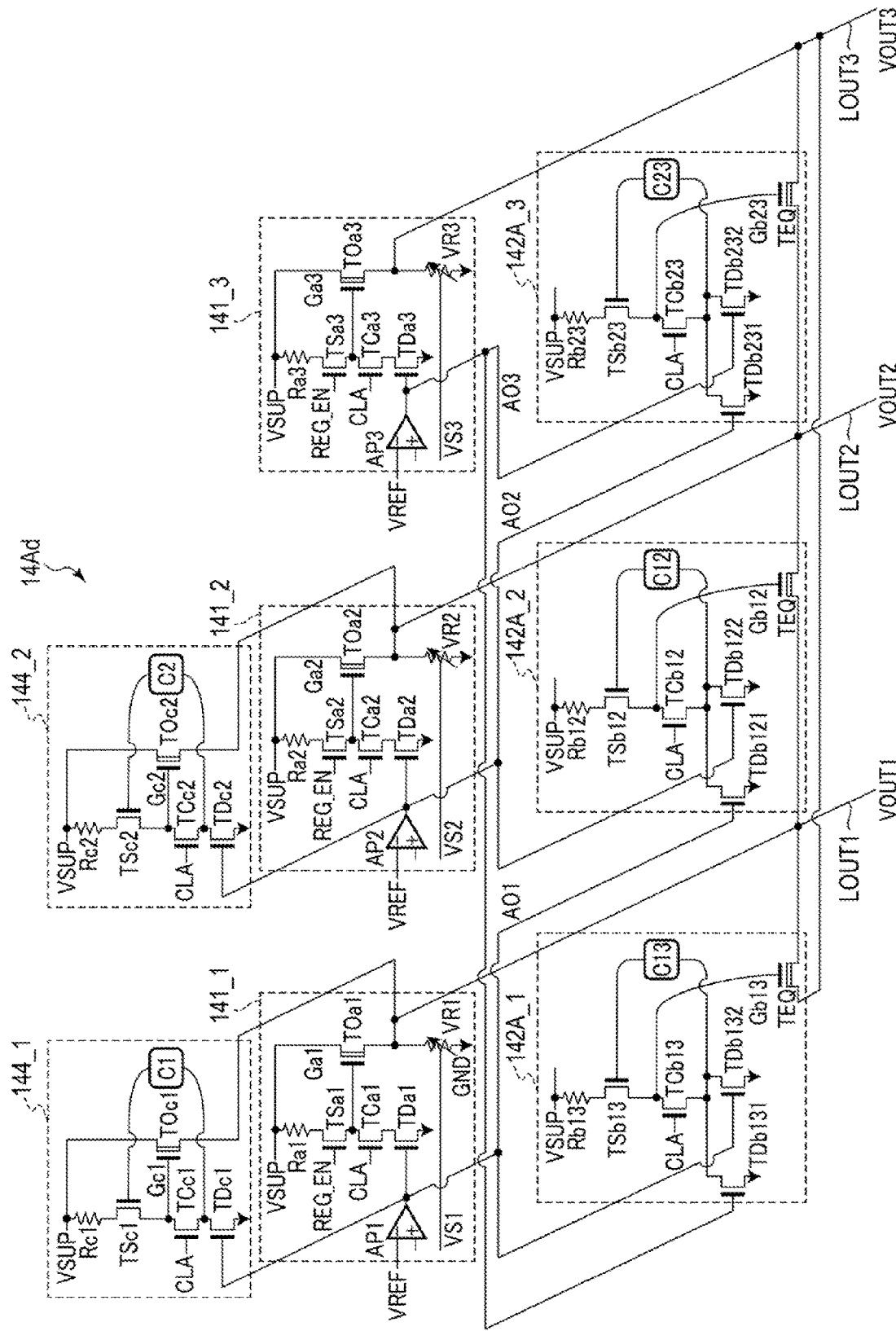
FIG. 13 is a circuit diagram illustrating another second configuration example of the regulator group according to the third embodiment.

FIG. 13 is a circuit diagram illustrating a configuration of the regulator group 14Ad. The regulator group 14Ad is obtained by adding drive circuits 144_1 and 144_2 for driving the voltages VOUT1 and VOUT2 to the regulator group 14Ab described above. In other words, the regulator group 14Ad is obtained by excluding the drive circuit 144_3 for driving the voltage VOUT3 from the regulator group 14Ac. The regulator group 14Ad is used when a capacitive load of a line (for example, the word line WL) to which the voltage VOUT3 is supplied is small.

The other circuit configuration of the regulator group 14Ad is the same as the circuit configuration of the regulator group 14Ab illustrated in FIG. 11. An operation of the regulator group 14Ad is the same as the operation of the regulator group 14Ac illustrated in FIG. 12 except the operation of the drive circuit 144_3.

3.3 Effect of Third Embodiment

According to the third embodiment, it is possible to provide a semiconductor storage device capable of increasing an operation speed as in the first embodiment described above.

Furthermore, the voltage generation circuit according to the third embodiment includes the drive circuit 144 for boosting the voltage VOUT generated by each regulator. The drive circuit 144 operates during a period in which the voltage VOUT is boosted to the target voltage and stops an operation when the voltage VOUT reaches the target voltage.

As a result, the voltage VOUT to be boosted can be boosted to the target voltage at a high speed, compared with the first and second embodiments. Furthermore, it is possible to stop the operation of the regulator by detecting that the voltage VOUT reaches the target voltage. Accordingly, after the voltage VOUT is boosted to the target voltage, a current flowing through the drive circuit 144 corresponding to the voltage VOUT can be reduced during a period in which the voltage VOUT is not boosted. The other effect is the same as the effect of the second embodiment described above.

4. Fourth Embodiment

Next, a semiconductor storage device according to a fourth embodiment will be described. In the first to third embodiments, an nMOS transistor is used for a transistor for outputting the voltage VOUT and a transistor for performing equalization, and in the fourth embodiment, a p-channel MOS field effect transistor (hereinafter, referred to as a pMOS transistor) is used for the transistors. In the fourth embodiment, a point different from the first embodiment will be mainly described.

4.1 Voltage Generation Circuit

Figure 14:
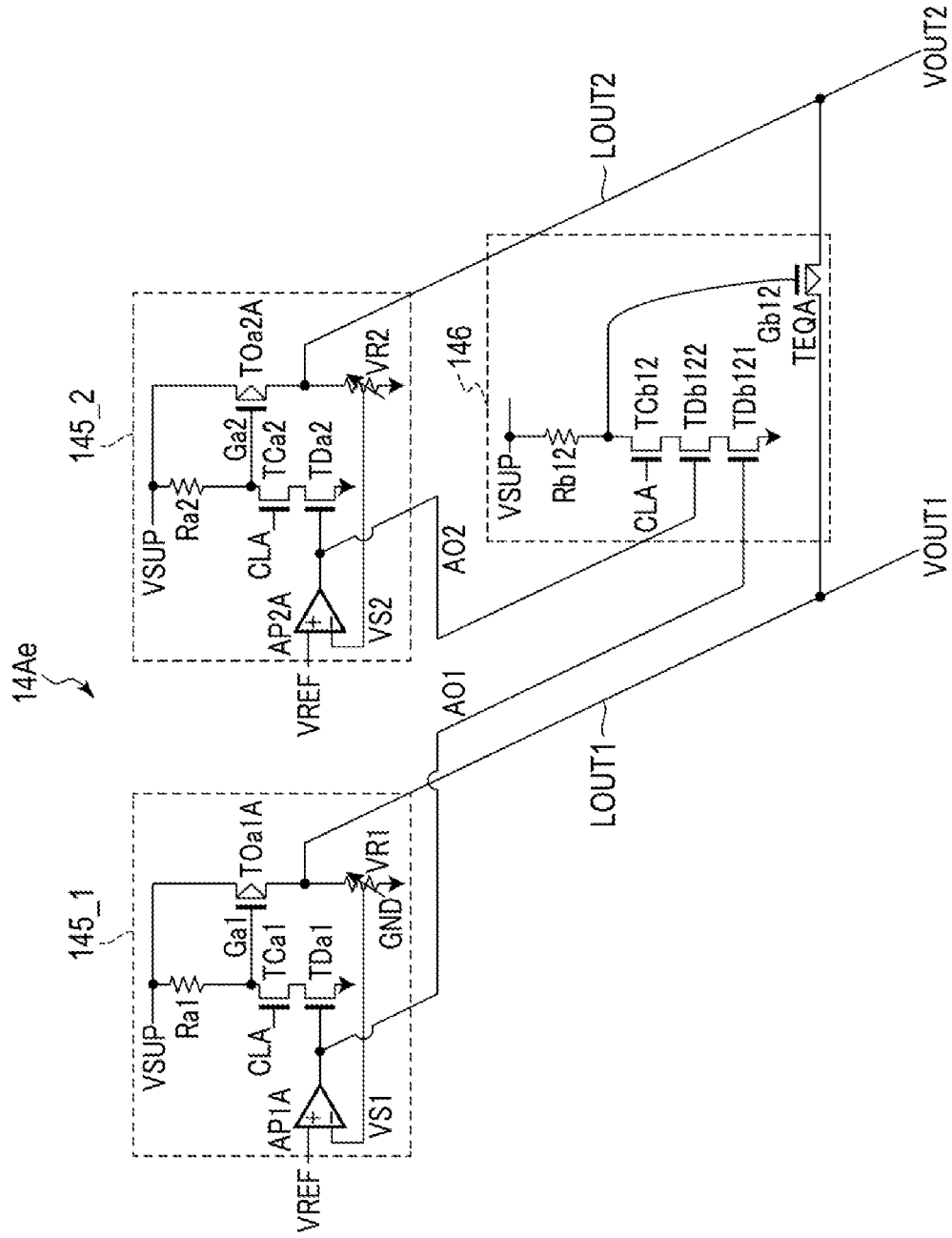
FIG. 14 is a circuit diagram illustrating a configuration of a regulator group according to a fourth embodiment.

A voltage generation circuit 14 according to the fourth embodiment includes a regulator group 14Ae. FIG. 14 is a circuit diagram illustrating a configuration of the regulator group 14Ae according to the fourth embodiment. The regulator group 14Ae includes two regulators 145_1 and 145_2 and an equalization circuit 146.

A circuit connection of the regulator 145_1 will be described below.

The regulator 145_1 includes a low voltage amplification circuit AP1A, nMOS transistors TCa1 and TDa1, a pMOS transistor TOa1A, a resistor Ra1, and a variable resistor VR1.

The voltage VSUP is supplied to a source of the pMOS transistor TOa1A. A drain of the pMOS transistor TOa1A is connected to the ground voltage terminal GND through the variable resistor VR1. A node between the drain of the pMOS transistor TOa1A and the variable resistor VR1 is connected to the line LOUT1. The line LOUT1 outputs the voltage VOUT1.

The voltage VSUP is supplied to a drain of the nMOS transistor TCa1 through the resistor Ra1. A source of the nMOS transistor TCa1 is connected to the ground voltage terminal GND through an nMOS transistor TDa1. A node between the drain of the nMOS transistor TCa1 and the resistor Ra1 is connected to a gate of the pMOS transistor TOa1A.

A resistance control terminal of the variable resistor VR1 is connected to an inverting input (−) terminal of the amplification circuit AP1A, and the voltage VS1 is input. The reference voltage VREF is input to a non-inverted input (+) terminal of the amplification circuit AP1A. An output terminal of the amplification circuit AP1A is connected to a gate of the nMOS transistor TDa1. A node between the output terminal of the amplification circuit AP1A and the gate of the nMOS transistor TDa1 is connected to a gate of the nMOS transistor TDb121 of the equalization circuit 146.

Next, a circuit connection of the regulator 145_2 will be described.

The regulator 145_2 includes a low voltage amplification circuit AP2A, nMOS transistors TCa2 and TDa2, a pMOS transistor TOa2A, a resistor Ra2, and a variable resistor VR2.

The voltage VSUP is supplied to a source of the pMOS transistor TOa2A. A drain of the pMOS transistor TOa2A is connected to the ground voltage terminal GND through the variable resistor VR2. A node between the drain of the pMOS transistor TOa2A and the variable resistor VR2 is connected to a line LOUT2. The line LOUT2 outputs the voltage VOUT2.

The voltage VSUP is supplied to a drain of the nMOS transistor TCa2 through the resistor Ra2. A source of the nMOS transistor TCa2 is connected to the ground voltage terminal GND through the nMOS transistor TDa2. A node between the drain of the nMOS transistor TCa2 and the resistor Ra2 is connected to a gate of the pMOS transistor TOa2A.

A resistance control terminal of the variable resistor VR2 is connected to an inverting input (−) terminal of the amplification circuit AP2A, and the voltage VS2 is input. The reference voltage VREF is input to a non-inverting input (+) terminal of the amplification circuit AP2A. An output terminal of the amplification circuit AP2A is connected to a gate of the nMOS transistor TDa2. A node between the output terminal of the amplification circuit AP2A and the gate of the nMOS transistor TDa2 is connected to a gate of an nMOS transistor TDb122 of the equalization circuit 146.

Next, a circuit connection of the equalization circuit 146 will be described.

The equalization circuit 146 includes nMOS transistors TDb121, TDb122, TCb12, a pMOS transistor TEQA, and a resistor Rb12. The nMOS transistors TDb121 and TDb122 have the same transistor characteristics.

The voltage VSUP is supplied to a drain of the nMOS transistor TCb12 through the resistor Rb12. A node between the drain of the nMOS transistor TCb12 and the resistor Rb12 is connected to a gate of the pMOS transistor TEQA. A source (or a drain) of the pMOS transistor TEQA is connected to the line LOUT1, and the drain (or source) of the pMOS transistor TEQA is connected to the line LOUT2.

A source of the nMOS transistor TCb12 is connected to the ground voltage terminal GND through the nMOS transistors TDb121 and TDb122 connected in series. In other words, the nMOS transistors TDb121 and TDb122 are connected in series between the source of the nMOS transistor TCb12 and the ground voltage terminal GND.

The regulators 145_1 and 145_2 and the equalization circuit 146 described above satisfy the following relationships.

[{Rb12·(channel width of TDb12)/(channel length of TDb12)}/{Ra1·(channel width of TDa1)/(channel length of TDa1)}]<1 where Rb12 and Ra1 indicate resistance values of the resistors Rb12 and Ra1, respectively, and TDb12 indicates either TDb121 or TDb122.

Ra1=Ra2

(channel width of TDa1)=(channel width of TDa2)

(channel length of TDa1)=(channel length of TDa2)

where Ra2 indicates a resistance value of the resistor Ra2.

The other configuration is the same as the configuration of the first embodiment described with reference to FIG. 7.

Figure 15:
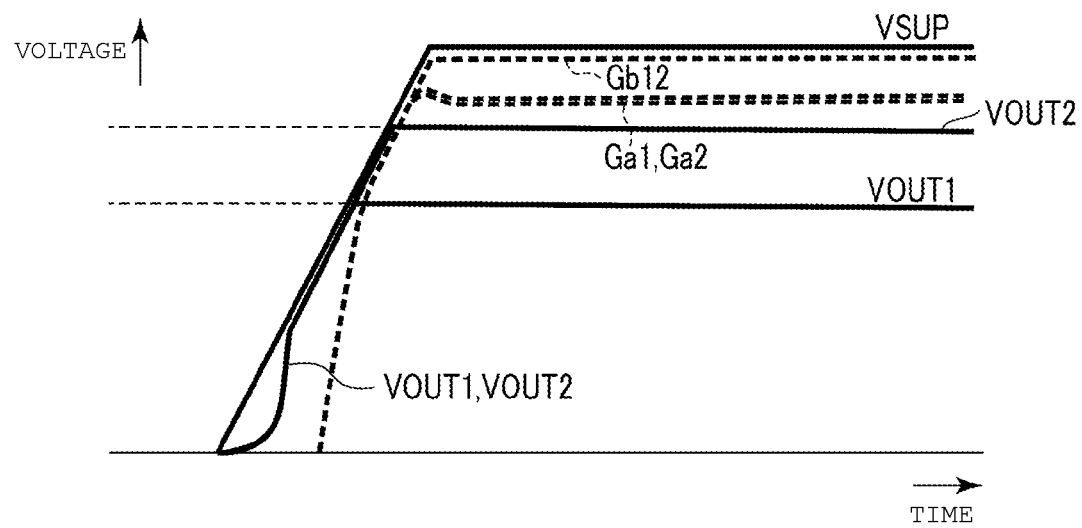
FIG. 15 is a voltage waveform diagram illustrating an operation of the regulator group according to the fourth embodiment.

Next, an operation of the regulator group 14Ae according to the fourth embodiment will be described. FIG. 15 is a voltage waveform diagram illustrating the operation of the regulator group 14Ae according to the fourth embodiment.

The reference voltage VREF is input to the non-inverted input (+) terminal of the amplification circuit AP1A, and the voltage VS1 from the variable resistor VR1 is input to the inverting input (−) terminal thereof. The amplification circuit AP1A amplifies a voltage difference between the reference voltage VREF and the voltage VS1 and outputs the voltage AO1. The voltage AO1 continuously changes according to a change of the voltage VS1 (or the voltage VOUT1). The voltage AO1 output from the amplification circuit AP1A is input to the gate of the nMOS transistor TDa1 and the gate of the nMOS transistor TDb121.

The reference voltage VREF is input to the non-inverting input (+) terminal of the amplification circuit AP2A, and the voltage VS2 from the variable resistor VR2 is input to the inverting input (−) terminal thereof. The amplification circuit AP2A amplifies a voltage difference between the reference voltage VREF and the voltage VS2 and outputs the voltage AO2. The voltage AO2 output from the amplification circuit AP2A is input to the gate of the nMOS transistor TDa2 and the gate of the nMOS transistor TDb122. The nMOS transistors TDb121 and TDb122 function as a pull-up circuit that increases the gate voltage Gb12 of the pMOS transistor TEQA to "H".

In the configuration described above, if operations of the regulators 145_1 and 145_2 start, the pMOS transistor TEQA is turned on, and thereby, the voltages VOUT1 and VOUT2 increase to the same voltage and the same slope as illustrated in FIG. 15. Then, the voltages VOUT1 and VOUT2 reach a target voltage of the voltage VOUT1. If the voltage VOUT1 reaches the target voltage, the voltage AO1 output from the amplification circuit AP1A becomes "L", and the nMOS transistors TDa1 and TDb121 are turned off. As a result, the gate voltage Gb12 of the pMOS transistor TEQA increases, and the pMOS transistor TEQA is turned off. Accordingly, a connection between the line LOUT1 and the line LOUT2 transition from a connection state to a disconnection state.

Thereafter, the voltage VOUT2 continuously increases and reaches a target voltage. If the voltage VOUT2 reaches the target voltage, the voltage AO2 output from the amplification circuit AP2A becomes "L", and the nMOS transistor TDa2 is turned OFF.

The gate voltages Ga1 and Ga2 of the nMOS transistors TOa1A and TOa2A become constant at a voltage higher than the voltage VOUT2 and lower than the voltage VSUP. The gate voltage Gb12 of the pMOS transistor TEQA becomes constant at a voltage higher than the gate voltages Ga1 and Ga2 but lower than the voltage VSUP.

4.2 Another Configuration Example of Voltage Generation Circuit

Next, another configuration example of the regulator group 14Ae in the voltage generation circuit 14 according to the fourth embodiment will be described. The voltage generation circuit 14 according to the fourth embodiment includes a regulator group 14Af.

Figure 16:
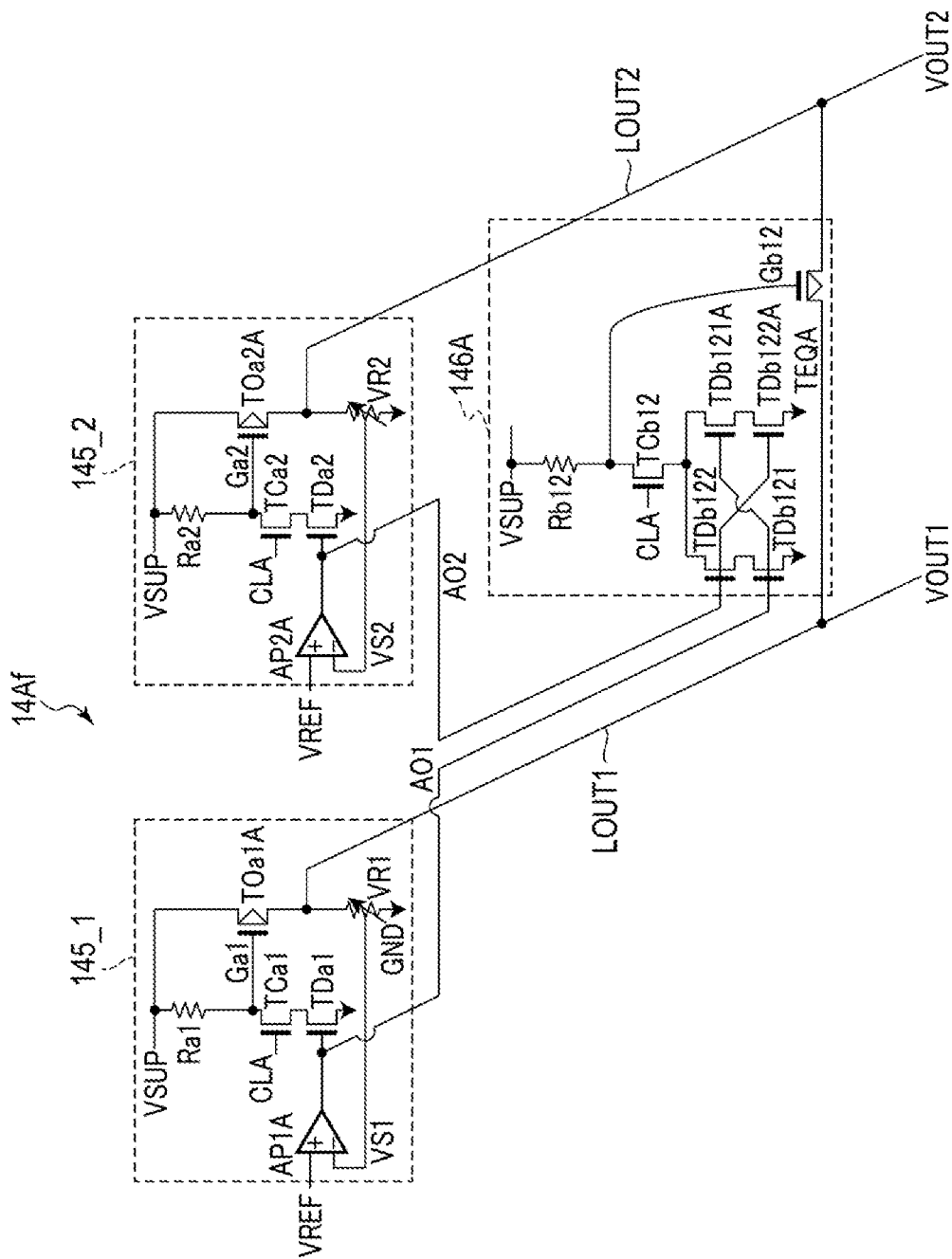
FIG. 16 is a circuit diagram illustrating another configuration example of the regulator group according to the fourth embodiment.

FIG. 16 is a circuit diagram illustrating a configuration of the regulator group 14Af. The regulator group 14Af is obtained by changing the configuration of the equalization circuit 146 for the above-described regulator group 14Ae. The regulator group 14Af includes two regulators 145_1 and 145_2 and an equalization circuit 146A.

A circuit connection of the equalization circuit 146A will be described below.

The equalization circuit 146A includes nMOS transistors TDb121, TDb122, TDb121A, TDb122A, and TCb12, the pMOS transistor TEQA, and the resistor Rb12. The nMOS transistors TDb121, TDb122, TDb121A, and TDb122A have the same transistor characteristics.

A source of the nMOS transistor TCb12 is connected to the ground voltage terminal GND through nMOS transistors TDb122 and TDb121 connected in series, and is connected to the ground voltage terminal GND through nMOS transistors TDb121A and TDb122A connected in series. In other words, the nMOS transistors TDb122 and TDb121 connected in series and the nMOS transistors TDb121A and TDb122A connected in series are connected in parallel between the source of the nMOS transistor TCb12 and the ground voltage terminal GND.

A node between an output terminal of the amplification circuit AP1A and a gate of the nMOS transistor TDa1 is connected to gates of the nMOS transistors TDb121 and TDb121A of the equalization circuit 146A. A node between an output terminal of the amplification circuit AP2A and a gate of the nMOS transistor TDa2 is connected to gates of the nMOS transistors TDb122 and TDb122A of the equalization circuit 146A. The other configuration of the regulator group 14Af is the same as the configuration of the regulator group 14Ae illustrated in FIG. 14.

The regulators 145_1 and 145_2 and the equalization circuit 146A described above satisfy the following relationship.

$[\{Rb12 \cdot (\text{channel width of TDb12})/(\text{channel length of TDb12})\}/\{Ra1 \cdot (\text{channel width of TDa1})/(\text{channel length of TDa1})\}] < 0.5$ where Rb12 and Ra1 indicate resistances values or resistors Rb12 and Ra1, respectively, and TDb12 indicates any one of TDb121, TDb122, TDb121A, and TDb122A.

Ra1=Ra2

(channel width of TDa1)=(channel width of TDa2)

(channel length of TDa1)=(channel length of TDa2)

where Ra2 indicates a resistance value of resistor Ra2.

Next, an operation of the regulator group 14Af according to the fourth embodiment will be described.

In the operation of the regulator group 14Af, switching from a connection state to a disconnection state between the lines LOUT1 and LOUT2 can be speeded up by adding the nMOS transistors TDb121A and TDb122A connected in series between a source of the nMOS transistor TCb12 and the ground voltage terminal GND. The other operation is the same as the operation of the regulator group 14Ae illustrated in FIG. 14.

4.3 Effect of Fourth Embodiment

According to the fourth embodiment, it is possible to provide a semiconductor storage device capable of increasing an operation speed as in the first embodiment described above.

Furthermore, in the fourth embodiment, the pMOS transistors TOa1A, TOa2A, and TEQA can be used instead of the nMOS transistors TOa1, TOa2, and TEQ used in the first embodiment, and it is possible to obtain an effect which is the same as the effect of the first embodiment.

5. Other Modification Examples

In the above-described embodiments, a NAND flash memory is described as an example of a semiconductor storage device, and the present invention is not limited to the NAND flash memory, is applicable to other semiconductor memories in general, and is also applicable to various storage devices other than semiconductor memories.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a memory cell array above a semiconductor substrate and including a plurality of memory strings, each memory string including a first select gate transistor, a second select gate transistor, and a plurality of memory cell transistors between the first select gate transistor and the second select gate transistor;
   a plurality of word lines, each of which extends in a first direction and a second direction crossing the first direction, wherein the word lines are stacked in a third direction crossing the first direction and the second direction, and are connected to gates of the memory cell transistors;
   a plurality of bit lines connected to first ends of the memory strings, respectively;
   a source line connected to second ends of the memory strings;
   a row decoder including a plurality of transfer transistors having first ends connected to the word lines, respectively, and second ends connected to a plurality of voltage supply lines, respectively; and
   a voltage generation circuit configured to supply a plurality of voltages to the voltage supply lines, respectively,
   wherein the voltage generation circuit includes
      a first power supply node from which a first power supply voltage is supplied,
      a second power supply node from which a second power supply voltage lower than the first power supply voltage is supplied,
      a first regulator having a first voltage output node from which a first voltage is output to at least one of the voltage supply lines, and having a first signal output node from which a first signal corresponding to a voltage level at the first voltage output node is output,
      a second regulator having a second voltage output node from which a second voltage is output to at least another one of the voltage supply lines, and having a second signal output node from which a second signal corresponding to a voltage level at the second voltage output node is output, and
      a switch circuit having
         a first transistor having a first end connected to the first voltage output node, a second end connected to the second voltage output node, and a gate connected to a first node,
         a second transistor having a first end connected to the first node, a second end connected to the second power supply node, and a gate to which the first signal is supplied from the first signal output node, and
         a third transistor having a first end connected to the first node, a second end connected to the second power supply node, and a gate to which the second signal is supplied from the second signal output node.

2. The semiconductor storage device according to claim 1, wherein
   the first regulator includes a first amplification circuit configured to output the first signal based on a voltage difference between the voltage level at the first voltage output node and a reference voltage, and
   the second regulator includes a second amplification circuit configured to output the second signal based on a voltage difference between the voltage level at the second voltage output node and the reference voltage.

3. The semiconductor storage device according to claim 1, wherein
   the voltage generation circuit further includes
      a third regulator having a third voltage output node from which a third voltage is output to another one of the voltage supply lines, and having a third signal output node from which a third signal corresponding to a voltage level at the third voltage output node is output, and
      a second switch circuit having
         a fourth transistor having a first end connected to the first voltage output node, a second end connected to the third voltage output node, and a gate connected to a second node,
         a fifth transistor having a first end connected to the second node, a second end connected to the second power supply node, and a gate to which the first signal is supplied from the first signal output node, and
         a sixth transistor having a first end connected to the second node, a second end connected to the second power supply node, and a gate to which the third signal is supplied from the third signal output node, and
      a third switch circuit having
         a seventh transistor having a first end connected to the second voltage output node, a second end connected to the third voltage output node, and a gate connected to a third node,
         an eighth transistor having a first end connected to the third node, a second end connected to the second power supply node, and a gate to which the second signal is supplied from the second signal output node, and
         a ninth transistor having a first end connected to the third node, a second end connected to the second power supply node, and a gate to which the third signal is supplied from the second signal output node.

4. The semiconductor storage device according to claim 1, wherein each of the first to third transistors is an n-channel MOS field effect transistor.

5. The semiconductor storage device according to claim 1, wherein
   the switch circuit further has a first resistor having a first end connected to the first power supply node, and a tenth transistor having a first end connected to a second end of the first resistor, and a gate to which a clamp signal is supplied, and
   the first ends of the second and third transistors are connected to the first node via the tenth transistor.

6. The semiconductor storage device according to claim 5, wherein
the switch circuit further has an eleventh transistor having a first end connected to the second end of the first resistor, a second end connected to the first end of the tenth transistor, and a gate to which a control signal is supplied, and
the first end of the tenth transistor is connected to the second end of the first resistor via the eleventh transistor.

7. The semiconductor storage device according to claim 6, wherein
the voltage generation circuit further includes a first circuit configured to block a current flowing through the switch circuit when the first transistor of the switch circuit transitions from turned-off state to turned-on state.

8. The semiconductor storage device according to claim 7, wherein
the first circuit supplies the control signal to the gate of the eleventh transistor based on at least one of a voltage level at the first end of the second transistor and a voltage level at the first end of the third transistor.

9. The semiconductor storage device according to claim 1, wherein
the row decoder further includes a block decoder configured to supply a block selection signal to gates of the transfer transistors.

10. A semiconductor storage device comprising:
a memory cell array above a semiconductor substrate and including a plurality of memory strings, each memory string including a first select gate transistor, a second select gate transistor, and a plurality of memory cell transistors between the first select gate transistor and the second select gate transistor;
a plurality of word lines, each of which extends in a first direction and a second direction crossing the first direction, wherein the word lines are stacked in a third direction crossing the first direction and the second direction, and are connected to gates of the memory cell transistors;
a plurality of bit lines connected to first ends of the memory strings, respectively;
a source line connected to second ends of the memory strings;
a row decoder including a plurality of transfer transistors having first ends connected to the word lines, respectively, and second ends connected to a plurality of voltage supply lines, respectively; and
a voltage generation circuit configured to supply a plurality of voltages to the voltage supply lines, respectively,
wherein the voltage generation circuit includes
a first power supply node from which a first power supply voltage is supplied,
a second power supply node from which a second power supply voltage lower than the first power supply voltage is supplied,
a first regulator having a first voltage output node from which a first voltage is output to at least one of the voltage supply lines, and having a first signal output node from which a first signal corresponding to a voltage level at the first voltage output node is output,
a second regulator having a second voltage output node from which a second voltage is output to at least another one of the voltage supply lines, and having a second signal output node from which a second signal corresponding to a voltage level at the second voltage output node is output, and
a switch circuit having
a first transistor having a first end connected to the first voltage output node, a second end connected to the second voltage output node, and a gate connected to a first node, and
a second transistor and a third transistor connected in series between the first node and the second power supply node, wherein the first signal is supplied to a gate of the second transistor from the first signal output node, and the second signal is supplied to a gate of the third transistor from the second signal output node.

11. The semiconductor storage device according to claim 10, wherein
the first regulator includes a first amplification circuit configured to output the first signal based on a voltage difference between the voltage level at the first voltage output node and a reference voltage, and
the second regulator includes a second amplification circuit configured to output the second signal based on a voltage difference between the voltage level at the second voltage output node and the reference voltage.

12. The semiconductor storage device according to claim 10,
wherein the first transistor is a p-channel MOS field effect transistor, and the second and third transistors are each an n-channel MOS field effect transistor.

13. The semiconductor storage device according to claim 10, wherein
the switch circuit further has a first resistor having a first end connected to the first power supply node, and a fourth transistor having a first end connected to a second end of the first resistor, and a gate to which a clamp signal is supplied, and
a first end of the third transistor is connected to the first node via the fourth transistor and a second end of the third transistor is connected to a first end of the second transistor, and a second end of the second transistor is connected to the second power supply node.

14. The semiconductor storage device according to claim 13, wherein
the switch circuit further has a fifth transistor and a sixth transistor connected in series between the first node and the second power supply node, and
the first signal is supplied to a gate of the fifth transistor from the first signal output node, and the second signal is supplied to a gate of the sixth transistor from the second signal output node.

15. The semiconductor storage device according to claim 14, wherein
a first end of the fifth transistor is connected to the first node via the fourth transistor and a second end of the fifth transistor is connected to a first end of the sixth transistor, and a second end of the sixth transistor is connected to the second power supply node.

16. The semiconductor storage device according to claim 10, wherein
the row decoder further includes a block decoder configured to supply a block selection signal to gates of the transfer transistors.

* * * * *